(12) United States Patent
Arimura

(10) Patent No.: US 9,460,381 B2
(45) Date of Patent: Oct. 4, 2016

(54) UNIVERSAL IC TAG, METHOD OF MANUFACTURING SAME, AND COMMUNICATION MANAGEMENT SYSTEM

(75) Inventor: Kunitaka Arimura, Kawasaki (JP)

(73) Assignee: Smart Co., Ltd., Kawasaki-Shi (JP)

( * ) Notice: Subject to any disclaimer, the term of this patent is extended or adjusted under 35 U.S.C. 154(b) by 150 days.

(21) Appl. No.: 14/233,908

(22) PCT Filed: Jul. 20, 2012

(86) PCT No.: PCT/JP2012/068415
§ 371 (c)(1),
(2), (4) Date: Apr. 4, 2014

(87) PCT Pub. No.: WO2013/012057
PCT Pub. Date: Jan. 24, 2013

(65) Prior Publication Data
US 2014/0231503 A1    Aug. 21, 2014

(30) Foreign Application Priority Data

Jul. 21, 2011   (JP) .................. 2011-160357

(51) Int. Cl.
| | |
|---|---|
| G06K 19/06 | (2006.01) |
| G06K 19/077 | (2006.01) |
| H01Q 13/10 | (2006.01) |
| H01Q 1/22 | (2006.01) |
| H01L 21/82 | (2006.01) |

(52) U.S. Cl.
CPC ......... *G06K 19/07773* (2013.01); *H01L 21/82* (2013.01); *H01Q 1/2225* (2013.01); *H01Q 13/10* (2013.01)

(58) Field of Classification Search
USPC ............................. 235/435, 492; 340/572.7
See application file for complete search history.

(56) References Cited

U.S. PATENT DOCUMENTS

| | | | | |
|---|---|---|---|---|
| 4,710,775 A | * | 12/1987 | Coe ..................... | H01Q 13/18 343/727 |
| 6,307,520 B1 | | 10/2001 | Liu | |
| 2002/0011959 A1 | | 1/2002 | Liu | |
| 2007/0017986 A1 | * | 1/2007 | Carrender ........ | G06K 19/07749 235/435 |
| 2007/0290941 A1 | | 12/2007 | Brown et al. | |
| 2008/0129625 A1 | | 6/2008 | Svensson et al. | |
| 2008/0245555 A1 | | 10/2008 | Li et al. | |
| 2010/0181379 A1 | * | 7/2010 | Okegawa ......... | G06K 19/07749 235/488 |
| 2011/0284642 A1 | | 11/2011 | Brown et al. | |
| 2012/0305656 A1 | | 12/2012 | Brown et al. | |

FOREIGN PATENT DOCUMENTS

| | | |
|---|---|---|
| CA | 2655451 A1 | 12/2007 |
| CN | 1341979 A | 3/2002 |
| CN | 1985405 A | 6/2007 |
| CN | 101506830 A | 8/2009 |
| CN | 101595596 A | 12/2009 |
| EP | 1176667 A3 | 9/2003 |
| GB | 2439124 A | 12/2007 |
| JP | H10145126 A | 5/1998 |
| JP | 2002084128 A | 3/2002 |
| JP | 2002152076 A | 5/2002 |
| JP | 2004180329 A | 6/2004 |
| JP | 2005203829 A | 7/2005 |
| JP | 2005218048 A | 8/2005 |
| JP | 2006114982 A | 4/2006 |
| JP | 4892608 B | 12/2007 |
| JP | 2008123222 A | 5/2008 |
| JP | 2009017282 A | 1/2009 |
| JP | 2009164145 A | 7/2009 |
| JP | 2009251974 A | 10/2009 |
| JP | 2009540715 A | 11/2009 |
| JP | 2010514243 A | 4/2010 |
| JP | 2010109692 A | 5/2010 |
| WO | 2006/006898 A1 | 1/2006 |
| WO | 2007144574 A1 | 12/2007 |
| WO | 2008075039 A1 | 6/2008 |
| WO | 2010022250 A1 | 2/2010 |

* cited by examiner

Primary Examiner — Daniel Hess
(74) Attorney, Agent, or Firm — James Creighton Wray; Meera P. Narasimhan

(57) ABSTRACT

A universal IC tag comprises a metal sheet $M_1$ having a hollow slot functioning as an antenna; plastic sheets laminated on the front and the rear surfaces of the metal sheet $M_1$; an IC arranged in the hollow slot, and a metal sheet $M_2$ laminated on the rear plastic sheet having a reflecting amplifying function. Such universal IC tag can transmits/ receive maximum energy by matching IC impedance with slot impedance and by attaining resonance between an IC capacitor and a slot inductance.

15 Claims, 28 Drawing Sheets

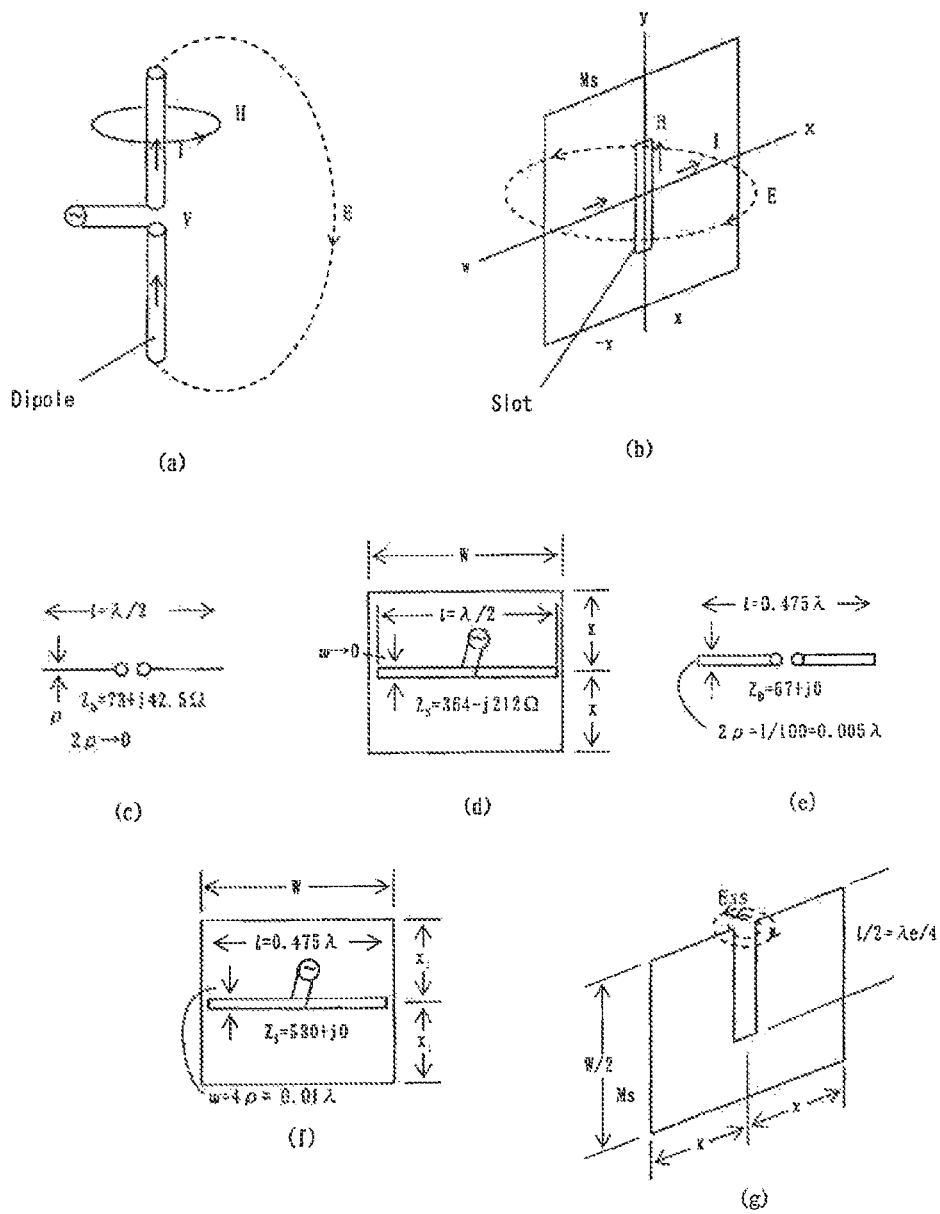

(a)

(b)

(c)

(d)

(a)

(c)

(b)

(d)

(e)

(g)

(f)

(h)

(a)

(b)

When $Z_B = 0$
$Z_A = j Z_0 \tan \beta X$ (c)

(d)

$\theta = \beta l$ radian
$\Delta \theta = 1° = 0.0175$ radian
$\Delta \beta l = \frac{2\pi}{360°} = 0.0175$ radian
$\lambda = 326$ mm
920MHz $\frac{2\pi}{326} \cdot l = 0.0175$
$l = 0.9$ mm
Deviation of 0.9mm
corresponds to $\theta = 1°$ error (e)

(a)

(b)

(c)

FIG. 8-2
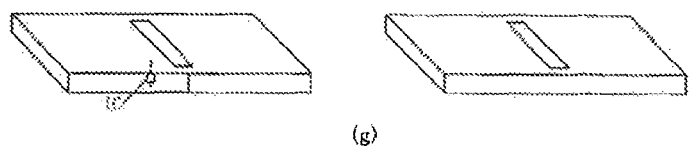
(g)
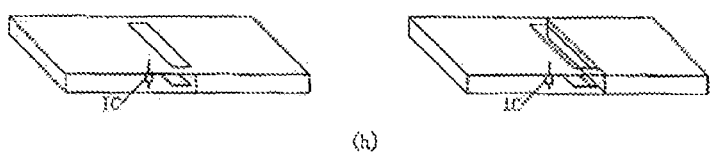
(h)
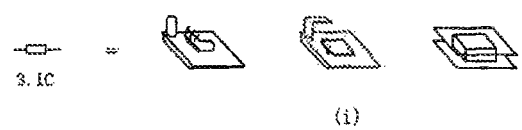
(i)
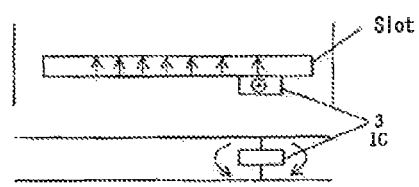
(j)
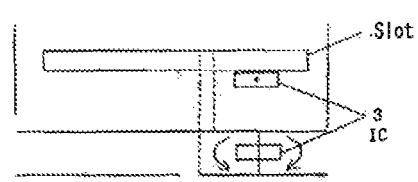
(l)
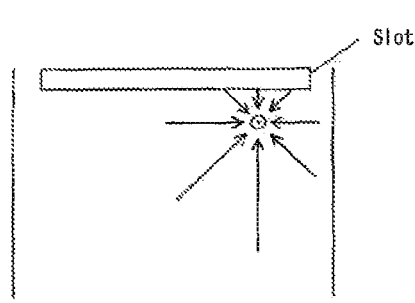
(k)
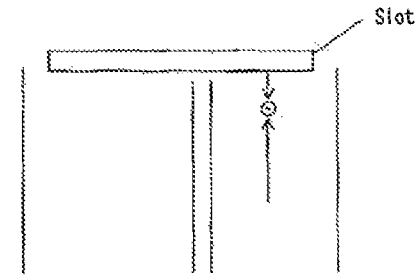
(m)

(a)

(b)

(c)

(d)

(e)

(f)

(g)

(h)

(a)

(b)

(c)

(d)

(e)

(a)

(b)

(c)

FIG. 14-2
(h) 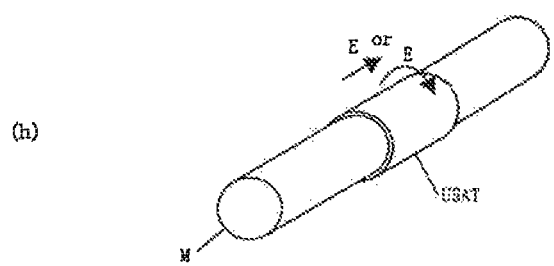
(i) 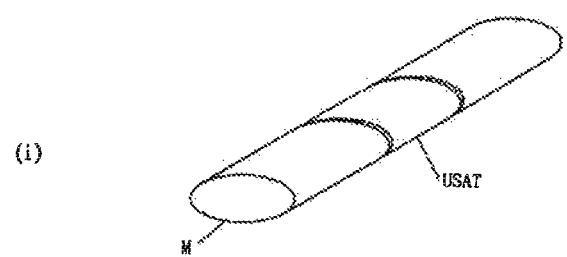
(j) 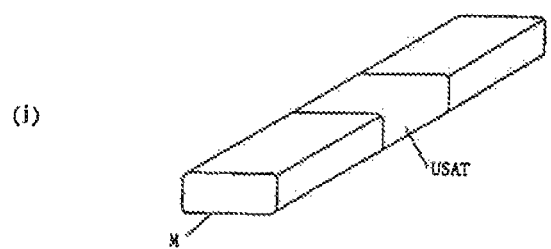
(k) 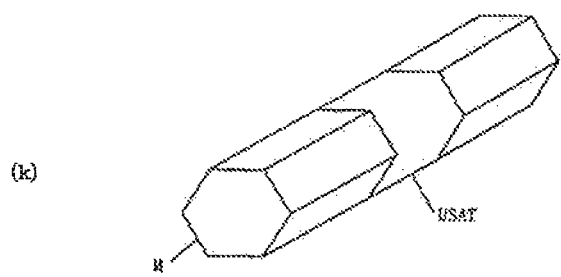

(a)

(b)

FIG. 16-2
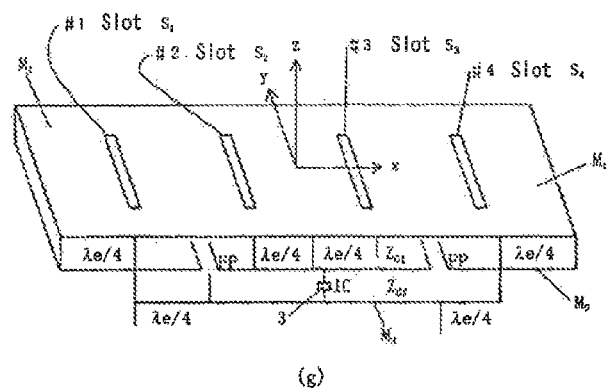
(g)
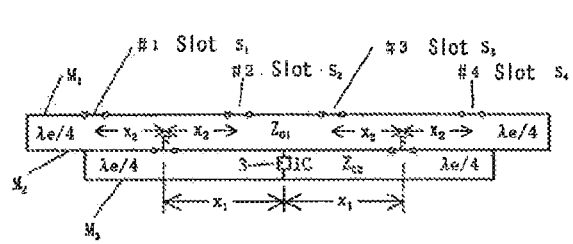
(h)
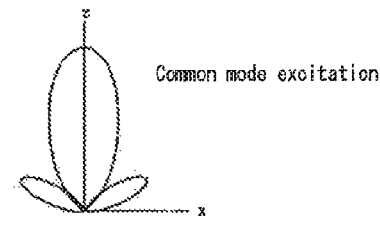
(i) Common mode excitation
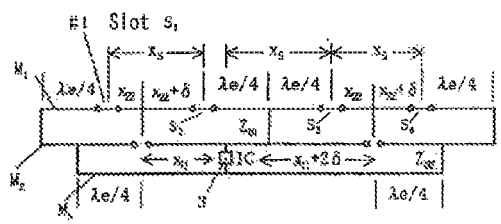
(k)
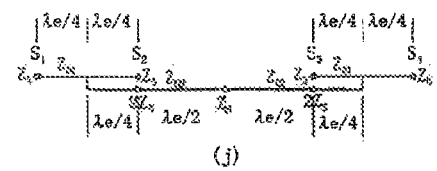
(j)
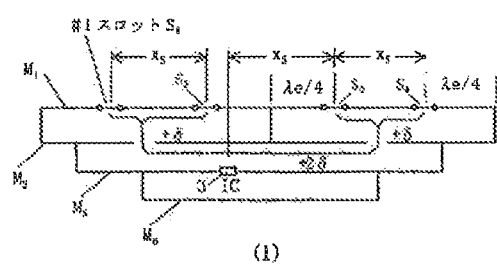
(l)
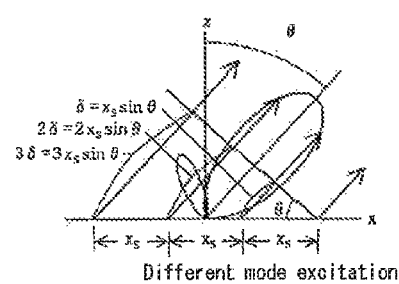
Different mode excitation
(m)

(a)

(b)

(c)

(a)

(b)

UNIVERSAL IC TAG, METHOD OF MANUFACTURING SAME, AND COMMUNICATION MANAGEMENT SYSTEM

This application claims the benefit of Japanese Application No. 2011-160357 filed Jul. 21, 2011, and PCT/JP2012/068415 filed Jul. 20, 2012, International Publication No. WO 2013/012057, which are hereby incorporated by reference in their entirety as if fully set forth herein.

FIELD OF THE INVENTION

The present invention relates to a universal IC tag formed in a plate shaped card and the like, which is not affected by metal surfaces, bottles, animals, human bodies and the like, used in RFIDs, IC tags, IC cards and so on, and relates to a manufacturing method of the same and relates to a communication management system.

RELATED BACKGROUND ART

A linear antenna, a printed antenna on a circuit board, a patch antenna, electromagnetic antenna comprising a magnetic substance and a coil wound around the magnetic substance are usually employed, these antenna are categorized as an electric filed type or a magnetic field type.

Usually a bar (linear) antenna, categorized as the electric field type, radiates from the electric field. However, in a high frequency band the radiation is deteriorated as an impedance of the antenna becomes zero by weakened electric field by metal surfaces, water, humans and animals. The electromagnetic antenna categorized as the magnetic field type, may enhance its efficiency by excitation of magnetic fluxes on the metal surface induced by an image effect. However, in a high frequency band such as VHF, the antenna cannot enhance its efficiency due to a deteriorated specific permeability, which means the magnetic substance core effects are not attained, as a result, an antenna efficiency cannot raised.

A slot antenna, categorized as the electric field type, having a slit or a slot formed in a metal surface, also utilized surface current and electric field. However, when there is a metal surface at rear side of the antenna, electric field generated in the slot area is compensated by the metal surface at the rear side, so that the slot area does not radiate.

A dipole antenna also has the same problem as the slot antenna. However, the dipole antenna can radiate symmetrically radiate in 360° around poles of the dipole antenna, while the slot antenna radiates only in upper direction and lower direction when the metal plate is placed horizontally. Utilizing these features as well as electric current and electric field, the metal surface itself can utilize as a part of the antenna by flowing metal surface electric current by induced current generated strong electric filed around a hollow slot formed in the metal surface, of which length is ca. half-wave.

The following technologies and patents are disclosed as prior arts.

An antenna comprising an IC attached to a slot, a metal plate to which a dielectric is sandwiched. In some cases, a thick dielectric is used in order to alleviate effects of the metal surface. A short circuit is formed at one side of such antennas, in order to alleviate effects of the lower surface of the metal surface, but since an area around the slot is open, effects of the lower metal surface cannot eliminate completely. When there are no metal surfaces, electric current path becomes short due to radiation from the slot area in one direction, so that excitation of the electric field is unfavorable. When the antenna receives radio waves, a voltage induced by received the radio waves is low, so that an excited voltage at the slot is low. A slot antenna for metal having a length of ¼ wave with a high impedance is available, but there are problems of impedance matching and radiation efficiency.

A composite antenna comprising a conductive antenna and a magnetic antenna is available, but such composite antenna has a complicated structure.

Patent applications relating to various slot antennas were filed, which are as follows: a composite antenna comprising a slot and a dipole, a waveguide type antenna having a slot, a slot antenna having a slot with ½ or ¼ wave.

REFERENCE LIST OF PRIOR ART

1. Japanese laid open patent No. 10-145126
2. Japanese laid open patent No. 2005-218048
3. Japanese laid open patent No. 2006-114982
4. Japanese laid open patent No. 2005-203829
5. Japanese laid open patent No. 2009-017282
6. Japanese laid open patent No. 2010-109692
7. Japanese laid open patent No. 2009-164145
8. Japanese laid open patent No. 2009-251974
9. Japanese laid open patent No. 2008-123222

SUMMARY OF THE INVENTION

Problems to be Solved by the Invention

In view of the above-mentioned prior arts, the following antennas, which positively utilize a metal surface and a human body, are required: an antenna comprising a slotted metal surface or a composite antenna comprising a metal surface and a slot antenna attached to the metal surface.

It is quite favorable if radiation could be controlled by forming a slot in accordance with size and shape of a metal surface. If an antenna is not affected by a metal surface behind and performs properly eve if metal surfaces do not exist, the antenna can be fitted to any object.

Since the slot antenna can transmit and receive, an IC mounted on the slot antenna can work by the power received from the antenna, and the IC also can transmit received signals from the antenna, thus a passive IC tag is obtained.

Since an active IC tag, to which power is always supplied, can transmit farther than the passive one, the active IC tag can be used in various applications. If the metal surface is utilized in transmitting and receiving, a more effective IC tag will be obtained.

If an IC having an I/O terminal, the IC can obtain circumferential information.

One of the objectives of the present invention is to downsize the IC tag and to make the IC tag thinner. However, the tag does not work properly, if the tag is merely downsized or made the tag thinner.

Other objective of the present invention is to obtain an IC tag which can transmit and receive signals effectively via a slot by matching the IC to the slot. If a half of the received power can be supplied to the IC, most effective communication is attained as being the IC matched to the slot. In other words, resistance of the IC coincides with resistance of the slot area, and capacitance of the IC and inductance of the slot area form a resonance circuit, so that the most effective communication is attained.

In order to solve the above-mentioned problems, the present invention provides a universal IC tag (USAT). A universal IC tag communication management system (USATS) is realized by utilizing the universal IC tag. An IC for the IC tag, an IC for an IC card or a dual interface IC can be used in the universal IC tag.

The objective of the present invention is to provide a universal IC which can be fitted to metal, water, humans and animals without interference.

Means to Solve the Problem

In order to solve the problems mentioned above, the universal tag by the present invention is constituted as one of the following arrangements from (1) to (28).

(1) A universal IC tag comprising: a metal sheet $M_1$; a slot formed in the metal sheet $M_1$ as a closed path with a length shorter than a width of the metal sheet $M_1$; an IC arranged in the slot, and a metal sheet $M_2$ arranged in parallel to the metal sheet $M_1$ via an insulating body, wherein: radio wave is radiated from the slot; the metal sheet $M_1$ and metal sheet $M_2$ are short-circuited at a position in a perpendicular direction to the slot and apart ¼ wave electric length from the slot, and an impedance from the slot to the metal sheet $M_2$ is infinite.

(2) The universal IC tag according to (1), wherein: an opening is formed in the metal sheet $M_2$ at a position corresponding to the slot.

(3) A universal IC tag comprising: a metal sheet $M_2$; a slot formed in the metal sheet $M_2$ as a closed path with a length shorter than a width of the metal sheet $M_2$; an IC arranged in the slot, and metal sheets $M_1$, $M_5$ respectively arranged front side and rear side of the metal sheet $M_2$ in parallel to the metal sheet $M_2$ via insulating bodies, wherein: radio wave is radiated from the slot; the metal sheet $M_2$, metal sheet $M_1$ and metal sheet $M_5$ are short-circuited at a position in a perpendicular direction to the slot and apart ¼ wave electric length from the slot; impedances from the slot to the metal sheet $M_1$ and metal sheet $M_5$ are infinite; openings are formed in the metal sheets $M_1$, $M_5$ at positions corresponding to the slot formed in the metal sheet $M_2$, such that a first tag portion is formed, and a plurality of tag portions with the same configuration as the first tag are arranged above and below the first tag portion.

(4) A universal IC tag comprising: a metal sheet $M_1$; a slot formed the metal sheet $M_1$ as a closed path with a length shorter than a width of the metal sheet $M_1$, and metal sheets $M_2$, respectively arranged front side and rear side of the metal sheet $M_1$ in parallel to the metal sheet $M_1$ via insulating bodies wherein: openings are formed in the metal sheets $M_2$, $M_5$ at positions corresponding to the slot formed in the metal sheet $M_1$, as a first tag part; a plurality of tag parts with the same configuration as the first tag part are formed above and below the first tag part; power supply points upper/lower sides of one side of the slot are short-circuited; an IC is arranged in the slot, and the IC is connected to any other the power supply points at the other-insulated slots.

(6) A universal IC tag comprising: a metal sheet Ms having a slot, and an IC arranged in the slot, of which impedance is matched beforehand, so as that the IC tag can be arranged on a metal plate having a cutout larger than the slot.

(7) The universal IC tag according to one of (1)-(6), wherein: a card length of the universal IC tag is shortened by bending the universal IC tag so as to meet a predetermined wave length.

(8) The universal IC tag according to one of (1)-(4), wherein: even when a plurality of the IC tags are piled, the universal IC tags can receive signals respectively.

(9) The universal IC tag according to one of (1)-(6), wherein: the universal tag is formed such that a ratio of a width w of the metal sheet to a thickness h of the insulating body satisfies the following equation: h/w>1/600.

(10) The universal IC tag according to one of (1)-(4), wherein: the insulating material has a small specific dielectric constant or a large permeability so as to raise a characteristic impedance between the metal sheets.

(11) The universal IC tag according to one of (1)-(6), wherein: the characteristic impedance between the metal sheets is 0.1-200Ω.

(12) The universal IC tag according to one of (2)-(4), wherein: a plurality of openings of the metal sheets are arranged so as to attain a directivity gain.

(13) The universal IC tag according to one of (1)-(4), wherein: power obtained from the slot generated by induced voltage between the metal sheets is supplied to the IC as matching impedances.

(14) The universal IC tag according to one of (1)-(6), wherein: the IC is connected to the slot via an impedance matching circuit.

(15) The universal IC tag according to one of (1)-(6), wherein: an adhesive sheet is attached to one side of the universal IC tag.

(16) The universal IC tag according to one of (1)-(6), wherein: the universal IC tag is attached to a band via attaching metal part.

(17) The universal IC tag according to one of (1)-(4), wherein: a portion of the metal sheet which is directly contacted to a metal surface, is rendered bare.

(18) The universal IC tag according to one of (1)-(4), wherein: a portion of the metal sheet which is directly contacted to a metal surface, is rendered in a state of capacitive short by a thin insulating film.

(19) The universal IC tag according to one of (1)-(5), wherein: the metal sheet in which slot IC is arranged, the insulating bodies sandwiching the metal sheet and a plurality of metal sheets sandwiching the insulating bodies are laminated; both ends of the laminated sheets are adhered, and the laminated sheets are cut into pieces so as to obtain individual universal IC tags.

(20) The universal IC tag according to one of (1)-(4), wherein: the universal IC tag is used for managing, pursuing, controlling or recording objects, humans and animals.

(21) The universal IC tag according to (2), wherein: openings are formed in the upper and lower metal sheets; radiation takes place to the upper and lower surfaces when the IC is arranged at a neutral position, or radiation takes place in the opposite direction to the metal surface on which the IC is arranged.

(22) The universal IC tag according to (2), wherein: respective ICs are arranged in opening formed in the upper and lower metal sheets, and different signals are received by the respective ICs.

(23) The universal IC tag according to (1), wherein: the universal IC tag further comprises a detecting antenna arranged a side face for detecting electric field and magnetic field, and signals from the IC are detected by detecting leaked electromagnetic field.

(24) The universal IC tag according to one of (1)-(6), wherein: the universal IC tag is flexible so as to be wound around a metal body, a watery object or an animal.

(25) A universal IC tag attached to a machinery, wherein: a slot having ¼ wave electric length is formed on the side face or inside of the machinery, terminals of an IC are directly attached to the slot via rivets or nails, or a film, a substrate or other substrate with a matching circuit to which the IC, is attached beforehand is attached to the slot such that the IC identifies the machinery.

(26) A manufacturing method of a universal IC tag, comprising steps of: punching slots with a predetermined distance apart in a long metal sheet; laminating plastic films on one surface or both surfaces of the punched metal sheet; arranging ICs in the slots during the laminating step, and cutting the laminated composite sheets into pieces so as to obtain individual universal IC tags.

(27) A communication management system for managing and controlling the universal IC tags specified by one of (1)-(6), wherein: the communication management system accesses computers and servers via a network.

(28) A communication management system for managing and controlling objects to which the universal IC tags specified by one of (1)-(6) are attached, wherein: the objects are processed, selected or stored based on data stored in the universal IC tags.

Effects Attained by the Invention

The universal IC tag by the present invention comprising the IC not affected by an object to which the IC tag is fitted, such as metal, water, a human, an animal or the like. Even if one of the surfaces of the universal IC tag is covered or disturbed by the metal or the like, the IC tag works properly. And even when the universal IC tags overlapped, communication function is not retarded. The universal IC tag working in any circumstance, and the USATS comprising the universal IC tag, can realize applications to metal, water, the human, the animal or the like, which have been thought to be impossible or to cost a lot.

BRIEF DESCRIPTIONS OF THE DRAWINGS

PREFERRED EMBODIMENTS BY THE PRESENT INVENTION

Hereinafter, the preferred embodiments by the present invention are explained in details.

Embodiments

Figures 1, 8:
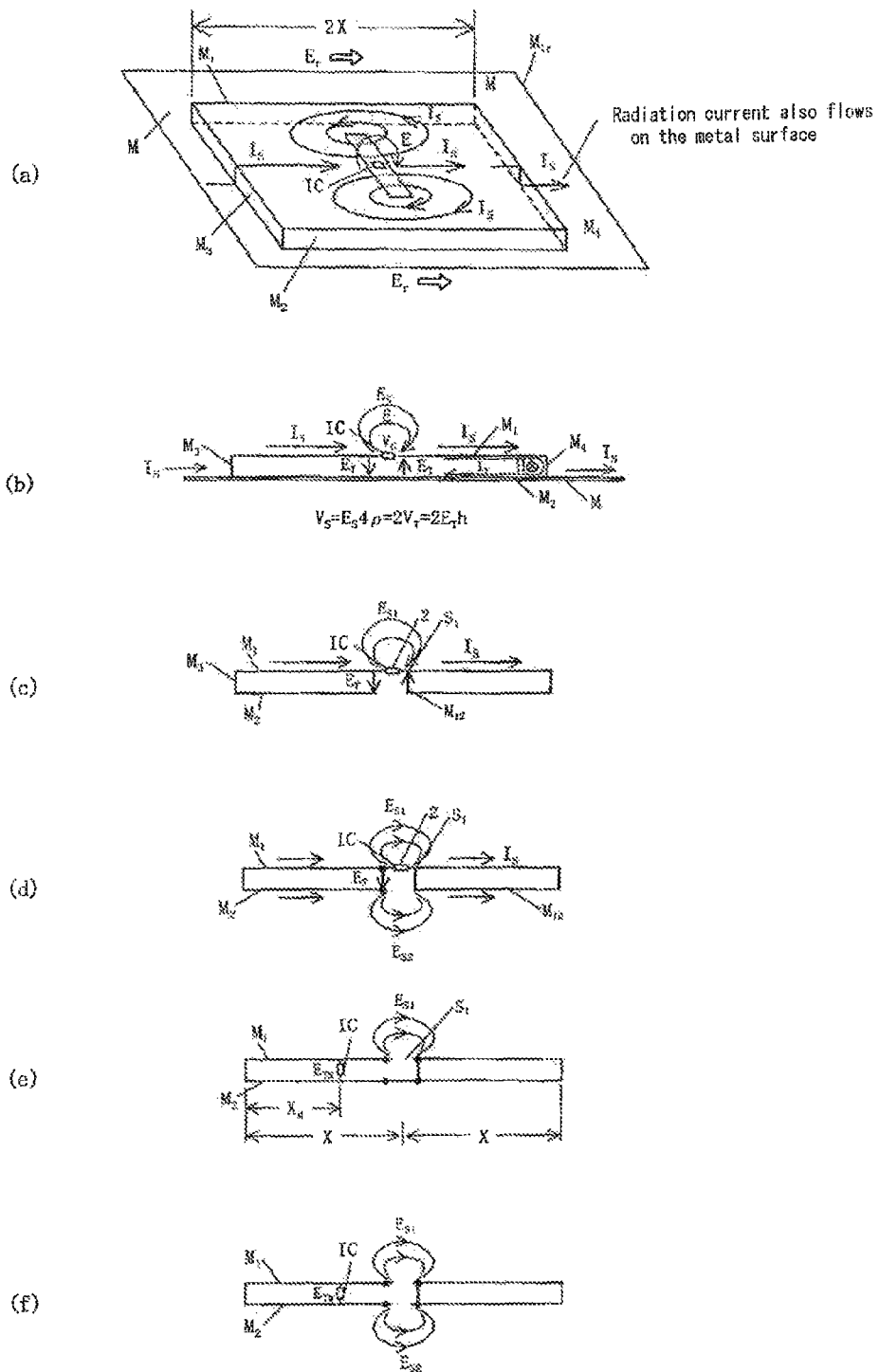
FIG. 1 is schematic views for explaining (a) a dipole antenna and (b) a slot antenna having ½ wave or ¼ wave slot length.
FIG. 8 is schematic views showing electric filed around the slot and excitation current generated by the electric field in relation to arranged position of the IC.

FIG. 1 is schematic views showing (a) the dipole antenna and (b) the slot antenna having ½ wave or ¼ wave slot length. In the drawings, reference character "E" represents electric field and reference character "H" represents magnetic field. The dipole antenna and the slot antenna are in a complementary relation. The electric field E and the magnetic field H are also in a complementary relation.

In the slot antenna, a slot 2 is formed on a metal surface Ms of a metal foil, a metal plate or the like, so that the slot per se is vacant. A width ω of the slot 2 is equivalent to two times of a diameter $2\rho$ of the dipole antenna, which means $\omega=4\rho$ (4 times of a radius $\rho$). A length l of the dipole and a length l of the slot are the same.

Since impedance characteristics were already calculated by Mr. Harren, King and so on, we may refer to the calculated results.

FIG. 1(c) shows a dipole antenna with a length l of ½ wave formed by a infinitely fine wire having a radius $\rho=0$ and a well known input impedance of the antenna; $Z_D=73+j42.5\Omega$.

FIG. 1(d) shows a slot antenna complementary to the dipole antenna shown in FIG. 1(c). In this drawing, a slot width $\omega=4\rho=0$, so that the input impedance of the dipole antenna; $Zs=364-j212\Omega$.

A relation between the two impedances is expressed as follows.

$$Z_D \times Z_S = [Zc/2]^2 = Zc^2/4 \qquad \text{Equation 1}$$

In Equation 1, Zc is a characteristic impedance of light or radio wave in free space and expressed as follows.

$$Zc = \sqrt{(\mu_0/\varepsilon_0)} = 120\pi = 377\Omega \qquad \text{Equation 2}$$

In Equation 2:

$\in_0 = 1/(120\pi \times 10^9)$ [F/m]

$\mu_0 = 4\pi \times 10^9$ [H/m]

$N_c = 1/\sqrt{(\in_0 \mu_0)} = 3 \times 10^8$ [m/s] (=velocity of light)

Zs is calculated by substituting Zc in Equation 2.

$$Z_s = 377^2/4Z_D = 35530/Z_D \qquad \text{Equation 3}$$

As stated above, since $Z_D = 73 + j42.5$, Zs is calculated as follows.

$$\begin{aligned} Z_s &= 35530/(73 + j42.5) \\ &= [35530/73^2 + (j42.5)^2] \cdot (73 - j42.5) \\ &= [35530/(5329 + 1806)] \cdot (73 - j42.5) \\ &= 364 - j212 [\Omega] \end{aligned}$$

In the input impedance Zs of the slot antenna, a radiation resistance component has a high value of 364Ω, and a reactance component is capacitive and has a high value of 212Ω.

Since the resistance component is high in the center of the slot, a transformer is employed so as to convert the impedance. Alternatively as mentioned below, an IC 3 is fitted at the end of the slot, a matching circuit is arranged, a line structure is adjusted or the like taking the impedance into consideration.

FIG. 1(e) shows a dipole antenna with a length l a little bit shorter than ½ wave (l=0.475λ). In this antenna, input impedance is $Z_D = 67 + j0\Omega$, which means the antenna has only the radiation resistance so that it is in a resonating state. Here a diameter 2ρ of the antenna is set $1/100 \cdot \lambda = 0.01\lambda$. Therefore ρ=0.005λ.

FIG. 1(f) shows a slot antenna complementary to the dipole antenna in FIG. 1(e). The slot antenna has only radiation resistance Zs showing a high value of 530 (calculated from Equation 3). Since the impedance in the slot antenna is high, an impedance matching with the IC 3 has to be a ratio of 10:1.

Here a slot width ω is calculated as follows. ω=4ρ=4× 0.005λ=0.02λ.

Further, FIG. 1(g) shows a half-sized slot antenna complementary to a monopole antenna. Since a slot shows parallel in the half-sized slot, impedance Zsh is thought to be twice of that of the half wave slot, which means Zsh=240π/$Z_D$=2Zs (ca. 1000Ω). Consequently, a width w of the transmission line is set further smaller.

As stating below, various frequency bands are used. At present most frequently used frequencies are 430 MHz (wave length: ca. 697 mm), 920 MHz (wave length: ca. 326 mm), 2.45 GHz (wave length: ca. 122.4 mm), 5.7 GHz (wave length: ca. 52.6 mm) in UHF band and further frequencies in VHF band are used. The above-mentioned wave lengths are calculated as if the radio wave radiated in space, but actually the wave lengths are reduced by a shortening coefficient of wave length (ca. 0.66).

Hereinafter a case of frequency=920 MHz (wave length: ca. 326 mm) is explained as an example.

A size and a thickness of the antenna are varied by a slot length l, a slot width ω, and a matching circuit, and varied also by a transmission line length which depends on the slot length l and the frequency. Since the thickness h has some relations with the slot length l and transmission line width w, the thickness h is a very important factor for downsizing and thinning of the antenna.

Usually it is considered that when the wave length λ is decreased as the frequency is increased, the antenna is downsized in proportion to the wave length. In addition, a ratio T=w/h is also an important factor to determine the size of the antenna as well as characteristic impedance Zo of the transmission line, here "w" is a line width and "h" is height of the transmission line (thickness of a dielectric). For example, if the width w of the transmission line is reduced to ½, the thickness h of the dielectric is reduced to ½ as far as the characteristic impedance Zo is kept the same constant value.

The characteristic impedance Zo of the transmission line is increased by a magnetic substance, which is explained below, thickness and width of the transmission line can be downsized by a factor of $1/\sqrt{\mu_r}$.

Figure 2:
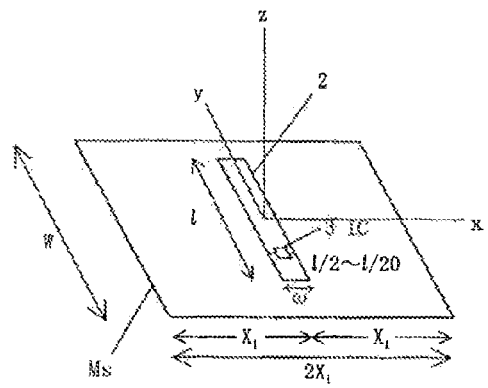
FIG. 2 is schematic views for explaining a slot formed in the center of a metal surface and an IC arranged in the slot.
Figure 2:
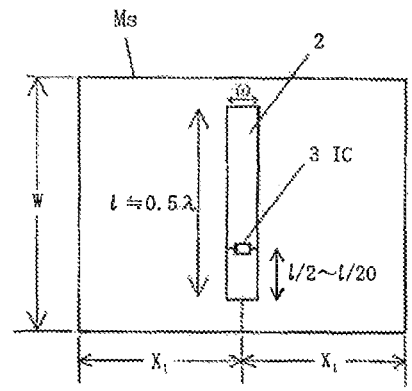
Figure 2:
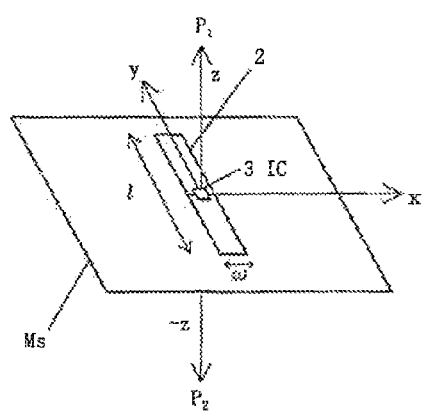
Figure 2:
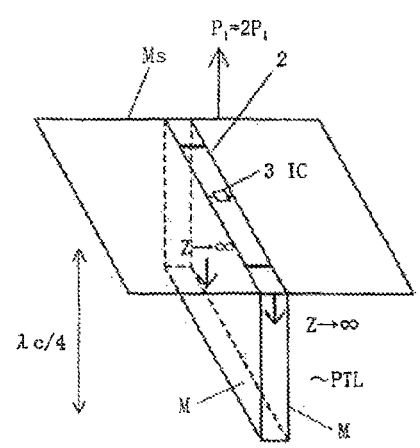
Figure 3:
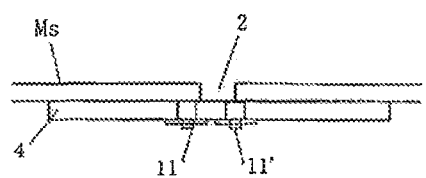
FIG. 3 is schematic showing various circuits formed in the metal surface, to which the IC is connected.
Figure 3:
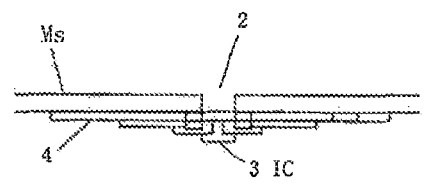
Figure 3:
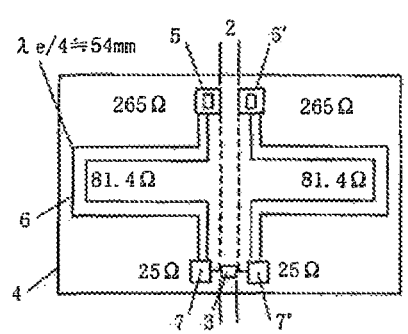
Figure 3:
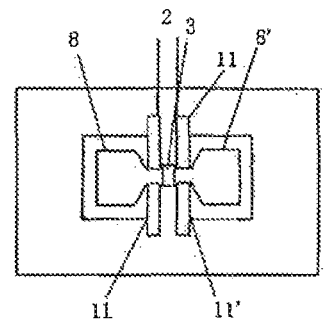
Figure 3:
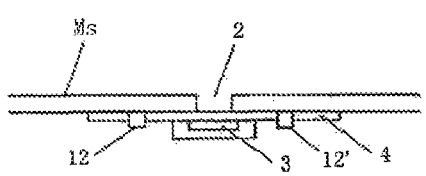
Figure 3:
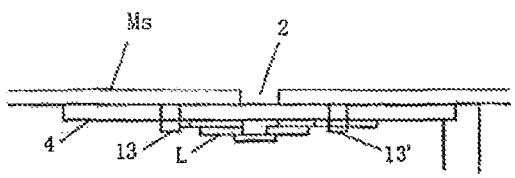
Figure 3:
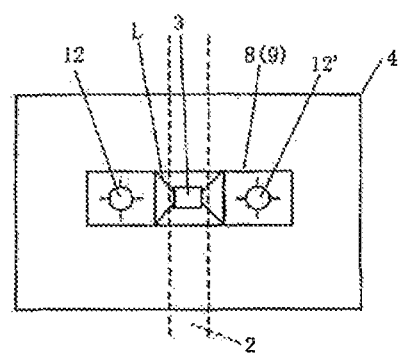
Figure 3:
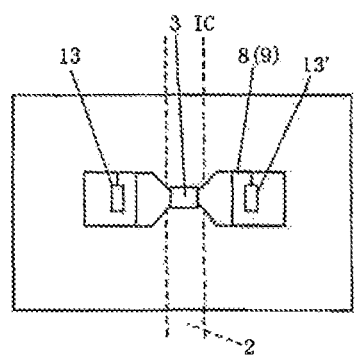

Hereinafter, a universal IC tag 1 comprising an IC 3 mounted on the slot directly or indirectly arranged in the slot 2 as referring to FIG. 2. The IC 3 for the universal tag is ordinary IC used for the IC card.

FIG. 2(a) is a perspective view of the universal IC tag comprising a metal surface Ms in which a slot 2 with a length l and a width ω is formed, and comprising the IC 3 mounted in near one end of the slot and connected directly or indirectly to power supply terminals on both side of slot.

The metal surface Ms in which the slot 2 is formed, has the following dimensions. A width (also referred as the line width) extending in a slot direction is designated as "w" referred as the line width. A length extending perpendicular to the slot 2 is designated as $2X_1$. The slot 2 is formed in the center a length $X_1$ from the edge of the metal surface Ms. Electric current flowing in x-axis direction excite electric field E, which induces a voltage V. The length $2X_1$ plays an important role to raise the induced voltage and to excite the electric field. When radio waves are received, electric field is excited, and a voltage of 2E is induced on the metal surface Ms. In order to flow the electric current, it is necessary to set the length $2X_1$ at a predetermined length. A length of a transmission line PTL (which will be explained below) relates to the length $2X_1$.

If the thickness h of the metal surface Ms is more than a skin depth around 920 MHz, which is ca. 2μ, there are no significant differences in terms of the thickness of the metal surface. However, usually the thickness is set 0.01-0.1 mm. In the present embodiment, aluminum or copper foil with a thickness of 0.01-0.1 mm is employed. However, the metal surface is not limited to the foil, but vapor deposited, coated or painted substrate is acceptable. Also thicker metal, such as brass, stainless steel, iron plate or the like is acceptable. As mentioned above, the slot width ω is set 2ρ (ω=2ρ). When the vapor deposition is used, the thickness can be reduced to ca. 0.001 mm. Even if the thickness of the metal face is reduced less than the skin depth, the metal face is usable, despite that the resistance and loss are slightly increased. The IC 3 is mounted on a position 1/21-1/201 from one end of the slot. As explained above, when the IC 3 is mounted in the center with high impedance, it is necessary to convert the impedance by employing the transformer. When the IC 3 is mounted at the end of the slot, the matching to reduce the reactance component to zero is necessary in some cases, even if the resistance component is matched.

Hereinafter the matching is explained. In order to resonate with an internal capacity of the IC 3, it is necessary to adjust the slot length l, the mounting position of the IC 3 to the slot 2, a short-circuit line length and the like. In order to set in a resonating state, the slot length l is set ca. 0.475λ. Actually, however, since the capacitance of the IC 3 is arranged in parallel, the slot length should be set properly so as to match with added inductance of the matching circuit or capacitance. It is possible to reduce the length of the slot 2 to ½-⅓ in y-axis direction by loading or bending the slot 2 (which is explained below in detail). In FIG. 2(b) the slot length l is set ca. 0.5λ (1≈0.5λ).

FIG. 2(c) shows symmetrical upward/downward radiations $P_1$, $P_2$ in z-direction from the slot 2 formed in the metal surface Ms. Radio waves are received in the same way. Electric current flows in the IC 3 connected to the slot 2 by supplied voltage, and power is radiated as radiations $P_1$, $P_2$ from the slot 2 excited by signals from the IC 3. Principally, the IC mounted slot works in any metal surface FIG. 2(d) shows a one way upward radiation P1 by arranging a trap parallel metal plate M line constituting a infinite line downward. Since the radiation is one way, the power of the radiation is doubled. Consequently, a gain of the antenna is doubled, so that 3 dB gain is obtained. As explained, in the present embodiment, 3 dB gain is added to the slot antenna. On the other hand, in the case of the conventional dipole antenna, the gain is dropped by such trap metal plate M. Since the metal surface Ms exists on both sides of the slot, and has the length of ½ wave, sufficient radiation is obtained.

Mounting examples of the IC 3 on the slot 2 formed in the metal surface Ms, and matching ways are explained as referring to FIGS. 3(a)-3(h). Corrections of the inductance and capacitance are explained below as referring to FIGS. 6, 7 and so on.

FIG. 3(a) shows a sectional view of the metal surface Ms to which a substrate 4 is arranged across the slot 2. Power supply pins 11, 11' are connected to power supply terminals 5, 5' arranged on the substrate 4. The power supply pins 11, 11' may be connected to the power supply terminals 5, 5' via rivets. However, when different metals are contacted, a galvanic corrosion is considered to take place. For example, brass is relatively stable to iron and aluminum. When the slot is formed in an iron plate, it had better plate over cut sections of the iron plate in order to prevent the galvanic corrosion.

FIG. 3(b) is a plan view of the substrate 4. The power supply terminals 5, 5' of the substrate 4 are connected to the power supply pins 11, 11' by crimping, soldering or conductive paint. The IC 3 is connected to IC connecting terminals 7, 7', which are connected with the power supply terminals 5, 5' via lines 6, 6'. The lines 6, 6' work as impedance converting circuits (=transformer). Impedance Zc for ¼ wave (ca. 82 mm at 920 MHz, ca. 54 mm when the shortening coefficient (ca. 0.66) is applied) is expressed in Equation 4.

$$Zc=\sqrt{(Zin \cdot Zs)}=\sqrt{(50 \times 530)}=162.8[\Omega] \quad \text{Equation 4}$$

This impedance is shared in the both lines, so that characteristic impedance of one line is 81.4Ω. Which means when the line impedance is determined as 81.4Ω and the input impedance Zs of the slot is determined as 530, matched impedance 50Ω for the connecting terminals (25Ω for one terminal) is obtained.

The above explanation is for the slot 2 having ½ wave length. When the slot length is reduced to half, i.e. ¼ wave length, since the input impedance for the slot is doubled as mentioned above, Impedance Zc is expressed in Equation 5.

$$Zc=\sqrt{(Zin \cdot 2Zs)}=\sqrt{(50 \cdot 2Zs)} \quad \text{Equation 5}$$

Since 2Zs is 1060Ω, Zc=Ca. 230Ω. The impedance for one terminal is 115Ω.

In the ¼ wave length transformer, when two impedances are determined as 530Ω and 50Ω, an impedance ZT of a transformer (the lines 6, 6') is calculated by Equation 6.

$$Z_T=\sqrt{(530 \times 50)}=162.8[\Omega] \quad \text{Equation 6}$$

Since the transformer consists of two the lines, each line having impedance of 81Ω makes the IC 3 match with the slot 2.

If the impedance of the connecting terminal IC 3 is not 50Ω, the characteristic impedance is adjusted according to Equation 4.

The circuits shown in FIG. 3(b) are formed in ⊐ shape. However, the circuits can be formed in zigzag shape or other desired shapes. In this drawing, the transformer 6 is formed as a balanced circuit, but the transformer may be formed in an unbalanced circuit.

If the circuit has a capacity, it can be adjusted by the slot length. If the slot length is shortened, the circuit becomes inductive. An inductance and a capacitance can be added on the substrate.

FIGS. 3(c), 3(d) show lead terminals 8, 8' of an inlet, on which the IC 3 is mounted. The power supply pins 11, 11' are folded around the lead terminals 8, 8' so as to be connected with the lead terminals. In these drawings, the power supply pins are directly connected with the IC 3, but they may be indirectly connected via the power supply terminals 5, 5' as shown in FIG. 3(b).

FIGS. 3(e), 3(f) show lead terminals 8, 8' attached to the substrate 4 via power supply pins 12, 12' protruding from the metal surface Ms. The power supply pins 12, 12' are configured as hooks such that the lead terminals are fitted to the substrate by pushing the power supply pins. In the present example, the lead terminals may be indirectly connected to the IC 3 via the power supply terminals 5, 5' and the IC connecting terminals 7, 7' as shown in FIGS. 3(a), 3(b). Since FIGS. 3(g), 3(h) show a variation of the configuration shown in FIGS. 3(e), 3(f), further explanations are omitted.

Hereinafter other embodiments of the slot antennas of which rear sides are covered with transmitting lines so as to attain one way radiation. In addition the other sides are configured not be affected by metal surfaces, water, hindrances and the like.

Figure 4:
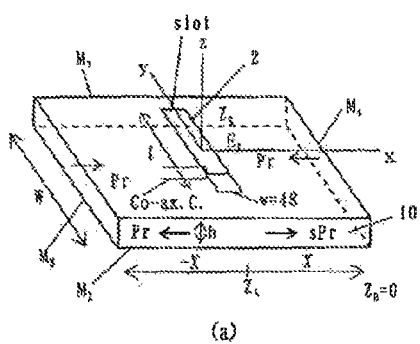
FIG. 4 is a schematic view showing a slot formed in the metal surface and other metal surface arranged parallel to the slot formed metal surface.
Figure 4:
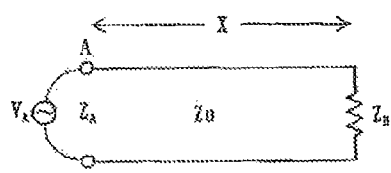
Figure 4:
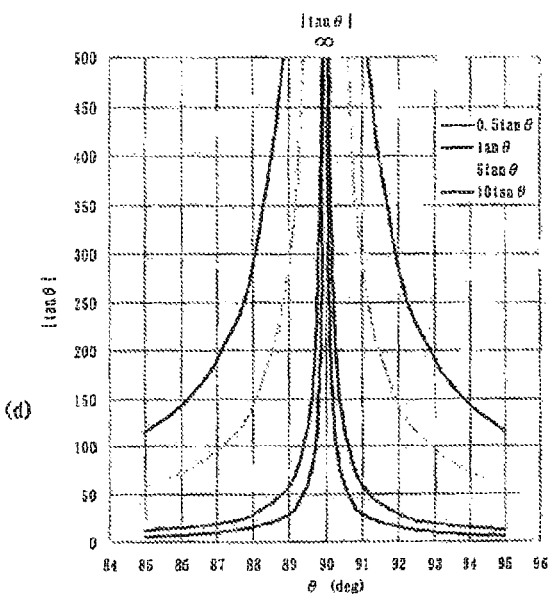
Figure 4:
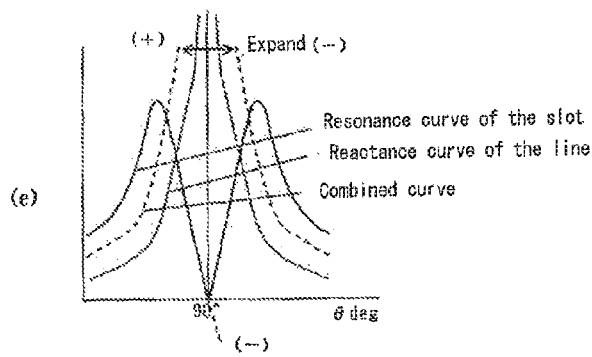

FIG. 4 is a schematic view showing a metal surface $M_1$ in which the slot 2 is formed and other metal surface $M_2$ arranged parallel to the metal surface $M_1$. In the present embodiment, a transmission line for forming a standing wave is arranged such that the electric field of the slot is kept being zero. Further, the present arrangement does not interfere the radiation from the slot 2. And a gain is raised by 3-4 dB than the dipole antenna. The electric field of the radiation is not reduced to zero by the metal surface on which the IC tag is placed, and not reduced to zero by human bodies. Animals, water and so on. The metal surface is allotted at the both sides of the slot 2 so as to excite electric fields in balance.

In the center of the metal surface with a length of 2X and a width of W, a slot 2 for about half wave having a length of l is formed. An insulating sheet 10, made of a dielectric material such as polyethylene (PE), PET, Teflon® and the like or a magnetic substance, is arranged below the metal surface $M_1$. The other metal surface $M_2$ with the same size as the metal surface $M_1$, is arranged so as to sandwich the insulating sheet 10. A thickness h of the insulating sheet 10 is 1-10 mm, but the thickness h should not be thinner, since the thickness affects the characteristic impedance Zo of a line of the present parallel configuration. Actually, PE or Teflon® sheet with thickness of 1-3 mm is employed.

Both ends in x-direction of the two metal surfaces $M_1$, $M_2$ are short-circuited by respective metal surfaces $M_3$, $M_4$, so that the electric filed and the magnetic field neither leak out nor affected by the environment. As mentioned below, a downward impedance at a slot radiation point make infinite without being affected by the environment. Instead of direct short-circuit by the metal surfaces $M_3$, $M_4$, a capacitive short-circuit by a laminate or the like may be allowable. It is probable to open the both ends of the parallel metal surfaces, but electric field leakage is generated, a complete open point is not attained and the slot is affected by the environment such as metal body outside.

Even if the open point with infinite impedance is obtained, a length of half wave $\lambda/2$ is required in the slot in order to convert the infinite impedance to the slot 2, so that the length of the line, which means the length the metal surface should be doubled. Consequently, use of such slot antenna is limited to special applications. Thin foils made of aluminum or copper is suitable for the metal surface, but sheets made of stainless steel or iron are also usable.

FIG. 4(b) is a sectional view along x-axis of FIG. 1(a), and shows voltage or current (magnetic field) distribution. A maximum voltage applied to the slot is defined as Vs, a voltage $V_T$ of the parallel metal surfaces is calculated as follows: $V_A = V_T = Vs/2$.

When electric field in the slot 2 directs rightward, electric filed at the right side to the slot directs downward and electric filed at the left side to the slot directs upward. Since magnetic field directs in the same direction at the both sides, Poynting power P at the left side directs leftward and the Poynting power P at the right side directs rightward. A relation between the line voltage $V_T$ and line electric field $E_T$ is expressed as follows: $V_T = E_T \cdot h$ ("h" is a thickness of the parallel metal surfaces), and $Vs = 2V_A = Es \cdot 4\rho$. Since Es is expressed in sine wave, the effective component of Es is the effective value.

In FIG. 4(b), the line voltage in the slot 2 formed in the center of the metal surface shows a maximum value and the line voltage at the short-circuits is zero. The line electric current shows a minimum value in the slot 2 and a maximum value at the short-circuits. Consequently, magnetic field H in the line shows a maximum value. And since standing wave is formed in the line, the electric current becomes almost zero, so that the line with infinite impedance is attained.

The characteristic impedance Zo in the parallel line is expressed in Equation 7.

$$Zo = \sqrt{(\mu o \cdot \mu_r / \in o \cdot \in_r)} \cdot [1/(\tau + 1.393 + 0.677 \ln(Z + 1.444))]$$

$$\tau = w/h \cdot (1.25t/\pi \cdot h) \cdot (1 + \ln(2h/t)) \approx w/h. \qquad \text{Equation 7}$$

Here "w" represents a width of the line.
As a result, the Equation 7 is approximated in Equation 8.

$$Zo \approx 120\pi \sqrt{(\mu_r / \in_r)} \cdot (h/w). \qquad \text{Equation 8}$$

Constants in the Equations are defined in Equation 9.

$$\in o = 1/(120\pi \cdot 10^9)[F/m], \mu o = 4\pi \cdot 10^9 [H/m]$$

$$Nc = 1/\sqrt{(\in o \cdot \mu o)} = 3 \cdot 10^8 [m/s]$$

$$Vr = 1/\sqrt{(\in o \cdot \mu o)} \cdot 1/\sqrt{(\in_r \cdot \mu_r)} = 3 \cdot 10^8 / \sqrt{(\in_r \cdot \mu_r)} [m/s] \qquad \text{Equation 9}$$

Specific dielectric constant $\in_r$ of PE or Teflon® is ca. 2.3.
Effective specific permeability $\mu_r$ of magnetic substances is usually 4-10, but a certain loss should be taken into consideration.

Equation 10 is obtained by putting the constants in Equation 9 into Equation 8.

$$Zo \approx 377\sqrt{(\mu_r/2.3)} \cdot h/w \approx 249 \cdot h/w [\Omega]. \qquad \text{Equation 10}$$

If h is 0.3 mm and w is 50 mm, the calculated value of Zo is ca. 1.5Ω. If h is 10 mm and w is 50 mm, the calculated value of Zo is ca. 50Ω

When the short-circuit impedance of the parallel line is Zs, the line impedance of the right side or the left side of the line is examined as referring to FIG. 4(c).

When the characteristic impedance of the line is Zo and the width of the line is X, a right side impedance $Z_A$ at a power supply point A in FIG. 4(c) is expressed as follows.

$$Z_A = Zo \cdot (Z_B + jZo \tan \beta X)/(Zo + jZ_B \tan \beta X)$$

If the impedance $Z_B$ at the end is set zero, $Z_A$ is calculated as follows.

$$Z_A = jZo \tan \beta X.$$

Here β is a propagation constant, which is defined in Equation 11.

$$\beta = 2\pi/\lambda = 2\pi f/Vr = \sqrt{(\in o \mu o \cdot \in_r \mu_r)} \cdot \omega$$

$$\omega = 2\pi f \qquad \text{Equation 11}$$

FIG. 4(d) shows the impedance $Z_A$ (depicted as absolute value) curve in relation to Zo values (0.5, 1, 5, 10) as a function of parameter X.

As shown in the drawing, the impedance $Z_A$ abruptly increases near $\lambda/4$ in the case of Zo=0.5. In other words, the impedance $Z_A$ increases infinitely, so that it becomes unstable to adjust the impedance $Z_A$ by varying the thickness h, the line width W or the line length X. According to the curve in the drawing, it is judged that virtually the impedance with infinite value may be obtained by thinning the thickness around 0.1 mm.

Consequently, when the characteristic impedance is determined 2-50Ω according to Equation 12, a stable line may be attained.

$$Zo \approx 377\sqrt{(\mu/\in)} \cdot h/w \qquad \text{Equation 12}$$

From Equation 12, it is concluded that the width of the linen w should be set as small as possible, and a foam body with a low specific dielectric constant or a high permeability of the insulating sheet 10 with the thickness h of 0.1-5 mm is preferable. In other words, it is desirable to set the thickness h of the insulating sheet >0.1. The $Z_A$ shows a large impedance, when the line width w is set 30-50 mm, the thickness h of the insulating sheet is 0.2-0.3. PE or Teflon® with specific dielectric constant $\in_r = 2.3$ is employed as the insulating sheet and the line length is ca. 53 mm at a frequency of 920 MHz in UHF band, so that the slot 2 is virtually not affected by the metal surface. In this case, the characteristic impedance Zo is 1-3Ω.

As shown in FIG. 4(e), a broad band characteristic may be obtained, by combining a resonating characteristic of the slot 2.

Since the slot length l becomes shorter in 2.45 GHz, the slot width to may be set narrower 10-25 mm.

Consequently, in order to keep good performance it is desirable to attain the characteristic impedance Zo as large as possible, by selecting the dielectric, the magnetic substance, the thickness and the line width properly. If surface area S of the metal surfaces $M_3$, $M_4$ has a certain value, a large capacitance C may be obtained according to Equation $C = \in S/d$, and $1/2\pi C$, i.e. a reactance component with nearly zero is realized.

Figure 5:
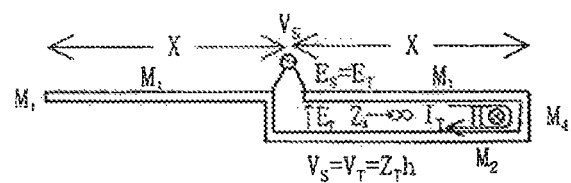
FIG. 5 is schematic views showing (a) one-sided transmission path and (b), (c) both-sided transmission path.
Figure 5:
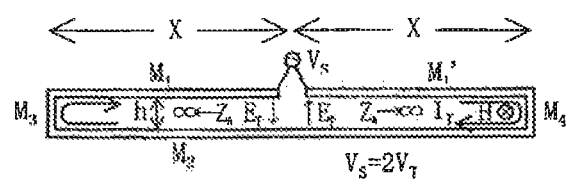
Figure 5:
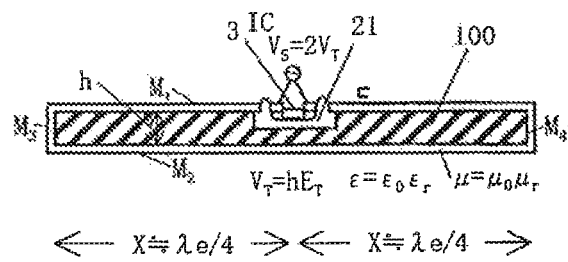

FIG. 5(a) shows the transmission path arranged at the rear side of the metal surface $M_1$ in the right side only. This transmission path is equivalent to FIG. 2(d) in which the trap parallel metal M is bent in rightward. The lower metal surface $M_2$ is connected to one edge of the slot 2 so such that the slot 2 has an infinite impedance at $\lambda e/4$.

FIG. 5(b) a parallel plate line path is formed symmetrically below the metal surfaces $M_1$, $M_1'$. The present configuration is basically the same as those shown in FIGS. 4(a), 4(b).

In FIG. 5(a), the voltage Vs at the slot 2 is directly applied as the line voltage, while in FIG. 5(b), the voltage Vs is divided into ½ and applied to the right/left lines.

As explained in the drawings of FIG. 4, since narrow band width or high precisions in size are required, when the transmission impedance is set too low, a high impedance for example near 50Ω is preferable. As if the impedance is doubled by dividing the voltage into two, therefore it is preferable to share the voltage in the right/left lines.

It is easier to manufacture a symmetrical transmission line with a uniform thickness. The both metal surfaces $M_3$, $M_4$ are necessary so as to obtain induction voltage V=E·2X (E is a strength of electric field of a coming wave).

FIG. 5(c) shows the both-sided transmission path in which a magnetic substance 100 with a specific dielectric constant $\in_r$=2.3 and a permeability μ is sandwiched by the metal surfaces $M_1$, $M_2$, and IC 3 is accommodated in a recess 21 of the insulating sheet 100.

As explained in the drawings of FIG. 4, since the characteristic impedance Zo is proportional to $\sqrt{\mu_r}$ ($\mu_r$: specific permeability of the magnetic substance), it is preferable to employ the magnetic substance 100 with a high specific permeability. As shown in FIG. 4(d), the line with high impedance of ¼ wave is obtained even if the thickness of the insulating film is thin.

The impedance with infinite value is obtained by the parallel line comprising the both metal faces $M_1$, $M_1'$ which form the slot 2 and the metal surface $M_2$ arranged below and parallel to the metal faces $M_1$, $M_1'$. The inductance and the capacitance of the slot 2, and the capacitance of the IC 3 can be simultaneously corrected by shifting the slot 2 slightly.

Figure 6:
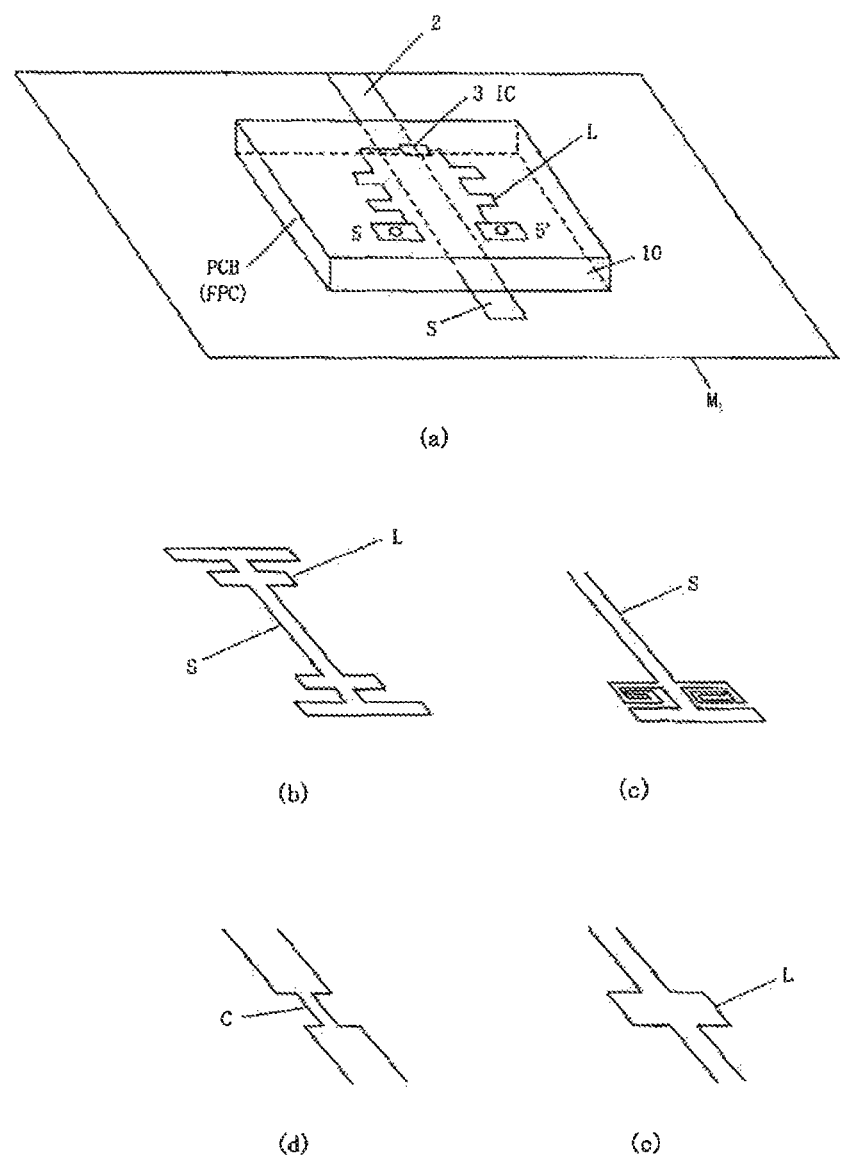
FIG. 6 is schematic views for explaining reactance control around the slot.
Figure 7:
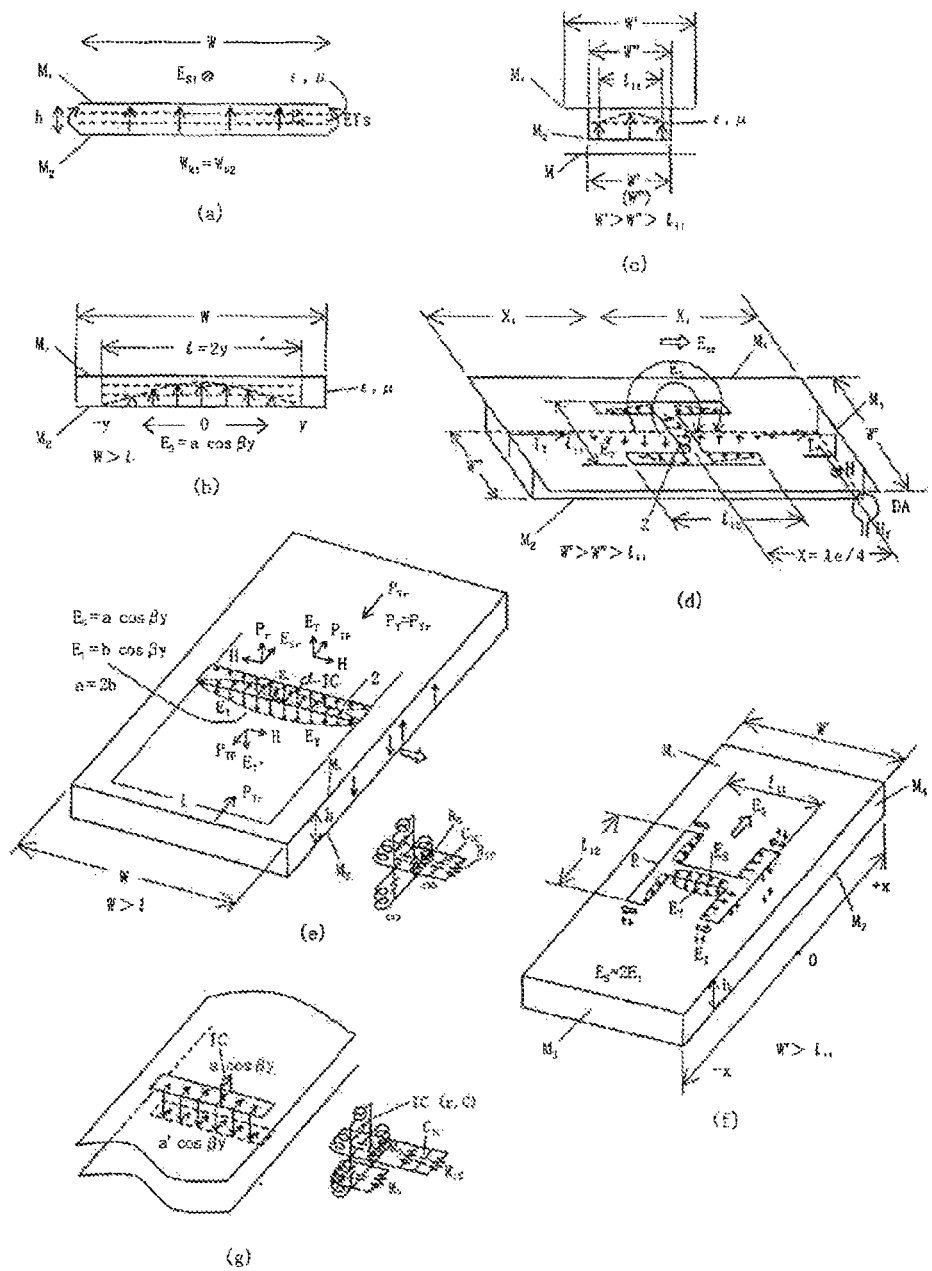
FIG. 7 is schematic views for explaining a relation between electric filed distribution and a distance of the two metal surfaces.

FIG. 6 shows other way to remove a reactance component between the slot 2 and the capacitance of the IC 3. As explained in the drawings of FIG. 1, the resonance state may be attained by adjusting the slot length l.

It is necessary to resonate a capacitor having some tens pico farad (pF) of the IC 3 of the universal IC tag. It is possible to shift the short-circuit slightly from ¼ wave to attain the resonance. However, it is advantageous to add the inductance and the corrected inductance separately, since the infinite impedance method can give a better property.

As explained above, since the resistance component at the end of the slot 2 is lower than that in the center, it is easy to match the resistance component of the IC 3, but the resonance with the capacitance of the IC 3 is not always attained.

Therefore, it is necessary to match the impedance by adding the inductance or a fine tuning capacitance.

Power supply terminals 5, 5' for supplying power to the slot 2 are arranged via through holes on a PCB at positions matching to the resistance components of the slot 2. The impedance is matched by fine tuning of the inductance, a capacitance on the PCB or a fixed capacitor as taking resonance with the capacitor of the IC 3. The inductance conversion circuit explained in FIG. 3 may combine with the circuits in the present embodiment.

However, since it takes time and costs to employ such circuits, it had better arrange inductance on the slot 2. As shown in FIG. 6(b) or 6(c), non-radiating reactance component may be added to the slit 2.

Capacitance can be increased by changing the slot width to of the slot abruptly narrow (under cut) as shown in FIG. 6(d). On the contrary resistance and inductance can be increased by changing the slot width ω of the slot abruptly wide (over cut) as shown in FIG. 6(e).

Hereinafter a transmission line attained by the parallel plates is explained.

FIG. 7(a) is a sectional view of metal surfaces $M_1$, $M_2$ with the same size arranged in parallel having idealistic electric filed distribution and magnetic field distribution. In the drawing electric field with a constant intensity $E_T$ is shown. In the line, electro-magnetic field state is the same as plane wave (TEM wave) state. In this case, the electric filed leaks $E_{TS}$ from the end a little bit. The IC 3 is identified by the leaked electric field $E_{TS}$, which will be explained below.

FIG. 7(b) shows electric field intensity distribution excited by the a lot 2 with the length l formed in the metal surface $M_1$. The electric shows a sine wave (cosine wave) with a maximum intensity in the center and nearly zero intensity at the ends.

As shown FIG. 7(d), 10(b), 10(c), the ends of metal surface $M_1$ is bent in X direction so as to reduce a slot length $l_{11}$. Total length ($l_{11}$+2x) of the metal surface is excited with a resonance length of ½ wave by a resonance current. Since a radiation part in the center is excited by a loop of the electric field, only a strong portion in the electric field intensity distribution is transmitted to the transmission line. And since a radiation electric field $E_S$ of the slot 2 is also excited by its strong portion without deteriorating the radiation, a radiation plane and the transmission line with a narrow slot width to is configured.

Since the upper metal surface $M_1$ plays roles of the radiation plane and the transmission line, it requires sizes to a certain extent. When the metal surface is narrowed or downsized, excitation of the radiation electric field is weakened. On the other hand, the lower metal surface $M_2$ plays only a role of the transmission line, so that it merely provides infinite impedance to the slot 2. However, the length of the lower metal surface is shorter than the slot length l, the electric field is leaked, so that the slot tends to be affected by the lower metal surface.

As shown in FIG. 7(d), since the electric filed intensity distribution is concentrated in the center of the slot 2 and only the concentration excites the transmission line, the impedance becomes infinite to this portion of the electric field, which means it should be configured that only the slot 2 makes the intensity of the electric field maximum. Therefore, even if a length w" of the metal surface $M_2$ is narrowed, the electric field leakage is little and infinite impedance can be configured. Further, even if other metal surface is arranged below, the electric filed is virtually zero and the infinite impedance can be configured, so that the slot is not affected by the metal surfaces around the slot.

In the present embodiment, a relation between widths w, w" of the metal surfaces and the effective slot length $l_{11}$ is as follows.

$$w > w'' > l_{11}$$

Since the electric field intensity distribution is mostly determined by a structure of the slot 2, the electric field is affected a little by the metal surface $M_2$ arranged below.

When a continuous electric current is generated in the lower metal surface $M_2$ by a current in the metals surface $M_1$ flowing in the metal surface $M_2$ via side metal surfaces $M_3$, $M_4$, the electric field around the slot 2 tends to be excited by such current. This is explained below as referring to FIG. 8(a).

Either the widths w, w" of the metal surfaces $M_1$, $M_2$ are the same or different, in what way the electric leakage is prevented by shortening the slot length $l_{11}$, is explained as referring to FIG. 7(d).

In FIG. 7(d), an H shaped slot is formed in the metal surface $M_1$. A length of the slot in y-axis direction is shortened from 1 to $l_{11}$, and two slots having a length $l_{12}$ corresponding to shortened extent in x-axis direction are formed at both end of the original slot. Here a resonance length l of the slot 2 is set nearly $l=l_{11}+l_{12}$. The slots with the length $l_{12}$ in x-axis direction do not contribute to the radiation, but they are reactance component. Radiation vectors of these slots offset each other.

Since both ends of the metal surface $M_2$ are short-circuited to the metal surface $M_1$ by the metal surfaces $M_3$, $M_4$ and since the electric field intensity distribution excited by the slot 2 have a wave pattern shown in FIG. 7(c), the wave pattern shows a standing wave, so that infinite impedance is obtained in the slot 2.

The electric field $E_S$ of the slot 2 extends outward from the slit 2 and forms radiation electric field $E_{Sr}$. In the transmission line, electric current $I_T$ becomes maximum at the ends and minimum at the slot 2. On the contrary intensity of the electric field $E_T$ becomes maximum at the slot 2 and minimum at the ends, so that voltage $V_{TS}$ of the transmission line becomes maximum at the slot 2 and electric current $I_{TS}$ becomes minimum (zero).

Consequently as explained in FIG. 4(c), the impedance $Z_A$ is expressed as follows.

$$Z_A = V_{TS}/I_{TS} \approx \infty (I_{TS}=0)$$

In the present case, electric field intensity distribution in the transmission line along lateral direction (y-axis) shows a sine wave where both ends are cut, as explained in FIG. 7(c).

Radiation from the slot 2 cut in x-axis direction may be neglected, because electric field is weak and intensity vectors offset each other.

FIG. 7(e) shows electric field Es generated in the slot 2 of the parallel plate line and electric field $E_T$ at both sides of the slot in x-axis direction excited by Es. Since electric field $E_T$ is excited at both sides, $E_T = \frac{1}{2}$ Es.

Directions of electric field and magnetic fields are shown by arrows in the drawing. And Poynting power P is also shown in the drawing. Power Pr radiates upward from the slot 2. Equivalent circuit of this parallel plate line is illustrated at the right side of the drawing. Electric filed intensity distribution of the slot 2 shows a sine wave.

FIG. 7(f) shows electric field intensity distribution in the H-shaped slot 2 and electric field intensity distribution in the line. Electric field Ex generated in y-axis slot 2 contributes to radiation, but electric field Ey generated in x-axis slots 2 compensate each other. Since electric field $E_T$ generated in the lines also compensate each other, virtually radiation does not leak. Since amplitude center of the electric field Ex is located in the y-axis slot 2, density of electric flux in the electric field Ex is high.

FIG. 7(g) shows a parallel plate line where slots are formed in the upper metal surface and the lower metal surface. Since transmission line impedances are in parallel resonance, the impedances are not so strongly connected. However, the two slots are connected to some extent. Here power is divided into upward and downward.

FIG. 8(a) shows an embodiment of the universal IC tag comprising the metal surface $M_1$ in which a slot with length of ½ wave formed, and the lower metal surface $M_2$ used as the transmission line.

As explained in FIGS. 4(a), 4(b), 5(b), the transmission line is arranged symmetrically such that metal surfaces M, $M_1'$ are arranged at both side of the slot symmetrically and the radiation electric field $E_S$ induces a current path in the slot. And exciting current Is flows symmetrically at both sides of the slot 2, so that induced voltage Vs is generated. Voltage Vo in the metal surface $M_1$ induced by the coming wave E is expressed as Vo=E·2X, so that X should be longer than ½ wave in order to obtain sufficient induced voltage Vo. If it is difficult to attain X with a sufficient length, it is necessary to think of effective ways to make X longer.

In FIG. 8(a), only the electric current Is flowing in the metal surface $M_3$ and induced electric field Es are explained. If the metal surface $M_3$ is mounted on the metal surface M, induced electric current partially flows in the metal surface M even if the metal surface M is coated with plastics or films, which are capacitive short so that some radiation takes place. Consequently, when the universal tag is mounted on the metal surface, in some case the whole metal surface plays a role of antenna, so that performance of the antenna is raised.

A plastic film with a width of 30 mm, a length of 10-120 mm and a thickness of 10μ has a capacity of from some hundreds to some thousands pF, as a result $1/j(\omega C)$ becomes low impedance of 0.02-3Ω so that capacitive short.

FIG. 8(b) is a sectional view of FIG. 8(a) in a crossing direction of the slit. The drawing shows electric field Es generated in the slot 2 and current Is flows on the metal surface M induced by the electric field Es. Almost all electric field becomes radiation electric field Er.

Up to this point, cases that no cutouts or slots are formed in the lower metal surface $M_2$ are explained.

FIG. 8(c) shows an example of the IC tag, in which a slot $S_2$ is formed in the lower metal surface $M_2$. Since impedance of the lower metal surface $M_2$ shows infinite value despite that a slot, a cutout or open end is formed or not, the slot $S_1$ on the metal surface $M_1$ is not affected. In other words, the slot $S_2$ or the open end formed in the center of the lower metal surface $M_2$ does not affect the performance of the IC tag.

Therefore, there is no need to think about that the lower metal surface covers the slot of the other metal surface when the universal IC tags are stacked.

FIG. 8(d) shows other example of the IC tag, in which the slot $S_1$ is formed in the metal surface $M_1$ and slot $S_2$ is formed in the metal surface $M_2$. Edges of the slots $S_1$, $S_2$ are short-circuited by a metal surface $M_{12}$.

The radiations in upward and downward are attained by this configuration. If the metal surface M is arranged below the metal surface $M_2$, the arrangement is equivalent to a one-sided trap shown in FIG. 8(a), so that only the upward radiation is possible. Versatile IC tags can be obtained by putting or by removing such metal surface M. Generally, the one-side radiation can obtain a higher gain, so that it is advantageous. But in some cases both sided radiations are required.

FIG. 8(e) shows an example of the IC tag, in which the slot $S_1$ is formed only in the metal surface $M_1$ and an edge of the metal surface $M_1$ and the metal surface $M_2$ are short-circuited. The IC 3 is connected to the both metal surfaces at a position $X_M$ from one end, such that the IC 3, the transmission line and the slot are arranged so as to attain matched communication.

FIG. 8(f) shows other example of the IC tag, in which the slot $S_1$ is formed in the metal surface $M_1$ and slot $S_2$ is formed in the metal surface $M_2$. Edges at right sides of the slots $S_1$, $S_2$ are short-circuited by a metal surface, so that a transmission line is obtained only in the left side. The IC 3 is connected to the both metal surfaces at a position $X_M$ from one end, such that the IC 3, the transmission line and the slot are arranged so as to attain matched communication. Signals from the IC 3 can be received from both slots $S_1$, $S_2$. When the IC tag 3 is placed in a space, radiation from both sides is attained. When a metal surface is fitted to either metal surface $M_1$ or $M_2$, radiation from the one side is attained.

FIG. 8(g) is a perspective view showing the IC 3 is connected to the metal surfaces $M_1$, $M_2$ evenly. The IC 3 is operated by voltage $V_T$ excited by electric field $E_T$ and transmits signals to the upper slot and lower slot. The IC 3 is protected by the transmission line and power can be supplied to each slot via the transmission line.

FIG. 8(g) is a perspective view showing the IC 3 is arranged at a impedance matching position.

FIG. 8(i) shows three examples of contacts or electrodes of the IC 3 to be connected between the upper and lower metal surfaces.

FIG. 8(j) shows the IC 3 arranged near the slot between the upper and lower metal surfaces. In this arrangement, electric current flows radially as shown in FIG. 8(k). In order to keep electric current flowing only in x-axis direction, a cutout is formed in the lower metal surface as shown in FIG. 8(l), 8(m).

Figure 9:
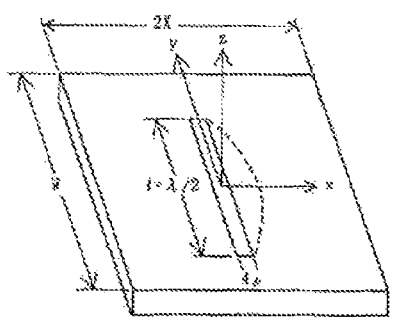
FIG. 9 is schematic views showing slots formed in various shapes.
Figure 9:
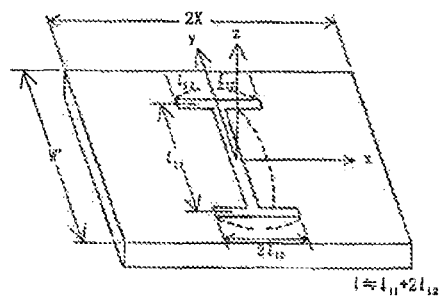
Figure 9:
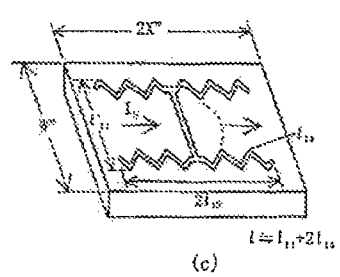
Figure 9:
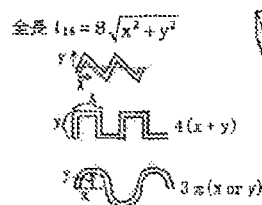
Figure 9:
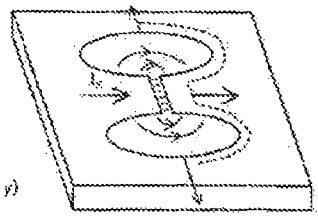
Figure 9:
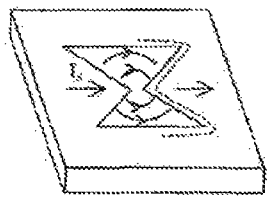
Figure 9:
Figure 9:
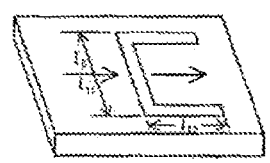

Hereinafter a method to shorten the slot length l in y-axis direction and to narrow the line width on the radiation plane as referring to FIG. 9.

FIG. 9(a) shows the ordinary configuration explained above, where the slot 2 is formed straightly in the metal surface $M_1$. This configuration may be used when sufficient dimensions in x-axis and y-axis directions and the thickness h are allowed.

In the case of 920 MHz in UHF band, half wave $\lambda/2$ is 160 mm, effective half wave) $\lambda e/2$ is 107 mm and $\lambda e/4$ is 54 mm as explained above. In the case of 2.45 GHz, $\lambda/2$ is 60 mm, $\lambda e/2$ is 40 mm and $\lambda e/4$ is 20 mm. In the case of 430 MHz, $\lambda/2$ is 350 mm, $\lambda e/2$ is 230 mm and $\lambda e/4$ is 115 mm. Therefore, in 2.45 GHz, an IC tag can be configured in a compact size. However, in 920 MHz and 430 MHz (in VHF band), it is required to shorten a length of the antenna in order to configure the compact sized IC tag.

FIG. 9(b) shows a H-shaped slot having a shortened length of $l_{11}$ in x-axis direction and at both end of shortened slot additional slots having length of $2 \cdot l_{12}$ are formed symmetrically in y-axis direction. Sum of the two lengths is determined to correspond to a resonating length $\lambda e/2$. Voltage distribution in the slot in y-axis direction shows a sine wave having a maximum value in the center and voltage distributions in the additional slots in x-axis direction show the sine wave. In this case, the shortening coefficient of wave length is ca. 0.66, which is the same as that of a dielectric material is applied to the slot. When insulating material made of magnetic substance is applied to the slot or the line, the shortening coefficient should be set smaller. The slot length l is calculated by the following equation: $l \approx l_{11} + 2 \cdot l_{12}$.

If a more compact IC tag is required, the length in x-axis direction is shortened by forming additional slots having a zigzag shape, a ⊐ shape or a wave shape as shown FIG. 9(c), 9(d).

When wave packet of the line electric filed $E_T$ excited in such shaped (i.e. not straight) slots disperses, the line having infinite impedance at $\lambda/4$ is not obtained even if both ends are short-circuited. Therefore metal surfaces $M_3$, $M_4$ of both ends should be formed in a flat surface in order to reflect the wave packet, in other words in order to obtain the line of $\lambda e/4$ with infinite impedance. When the characteristic impedance Zo attains high value, the impedance $Z_A$ at the end does not vary so much by the length of the slot, so that straight additional slots are preferable instead of the zigzag shaped one.

FIG. 9(e) shows the slot having an reentrant shape, and FIG. 9(f) shows the slot having a bow tie shape. Since these slots are formed partially in slant, it is difficult to configure the line having infinite impedance to the line electric field $E_T$ excited by the slot electric field $E_S$ when the metal surfaces $M_3$, $M_4$ are flat for short-circuiting. Since the intensity of electric field is concentrated in the center of the slot, and since the slot length is limited to $\lambda e/4$ or average value. it is difficult to configure the line having infinite impedance even if a wide range of characteristic frequency is obtained, except that $Z_D$ is raised.

FIG. 9(g) shows additional slots at both ends formed in a folded state, so that the slot length in x-axis direction can be shortened, while the slot length in y-direction is kept within an effective range. FIG. 9(h) shows additional slots at both ends extending only in +x-axis direction. Although this configuration loses the symmetry, virtually the same performance is obtained.

Hereinafter a relation the electric field Es in the slot and the electric field $E_T$ in the parallel line is explained as referring to FIG. 7(e).

FIG. 7(e) shows the intensity distribution of the electric field Ex=Es generated in the straight slot and the intensity distribution of the electric field $E_T$ in z-axis direction excited by the electric field Es. The slot electric field Es generates the intensity distribution in a sine wave pattern as shown in FIG. 7(b), 7(e). The electric filed Es generates the electric field $E_T$ in +z and −z axis directions under the presence of parallel metal surfaces $M_1$, $M_2$. The intensity of the $E_T$ is Es/2 having the intensity distribution in a sine wave pattern. Since the electric field at right side and left side of the slot along x-axis direct in opposite directions, Poynting power $P_{TF}$ at the right side moves rightward and reflected by the end. The reflected power $P_T r$ moves toward the slot, so that a standing wave is generated. Poynting power at the left side also generates standing wave in the same way. If there is nothing to cause loss in this configuration, this configuration forms a reactance circuit, which donates infinite impedance.

Portion of the electric field $E_S$ in the slot spreads as the electric field $E_S r$ radiating in z-axis direction. Only power supplied by the radiating electric field is resistance loss or radiation resistance. If a resistance component of the IC 3 is matched to this radiation resistance, power is supplied to the IC 3, so that modulated signals by the IC 3 can be derived.

Even if the IC 3 in placed in the center of the slot, where the resistance value is highest, the IC 3 is matched to impedance by utilizing a transformer, so that maximum energy can be supplied to the IC 3, as a result a communication range is maximized.

FIG. 7(f) shows the electric field intensity distribution in the H-shaped slot 2 as described in FIGS. 9(b), 9(c). The additional slots at both ends of the slot extend symmetrically in ±x-directions.

The intensity of the excited electric field Es in the slot distributes in a sign wave form in y-axis direction.

Since electric current in the additional slot (R) is divided rightward and leftward, intensity of the electric field is reduced to ½. Since the electric filed Es in the center of the slot directs in x-axis direction, the electric field Es contributes to the radiation.

Since the electric fields Esy at the additional slots are compensated each other, no radiation is caused. Also the electric fields $E_T$ in the transmission line at the right side and left side of the slot compensates each other, radiation is limited near the slot. Since the side surfaces of the parallel plate line is open, the tag can capture signals from the IC 3 excited by leaked electric field or the magnetic field, if there is slight leakage. An IC tag can be identified by the captured signals, even if a plurality of IC tags are piled up.

Figure 10:
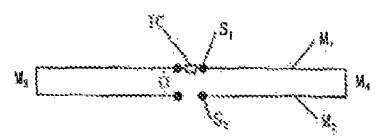
FIG. 10 is schematic views showing two-layered universal IC tags.
Figure 10:
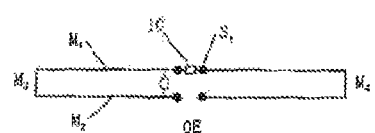
Figure 10:
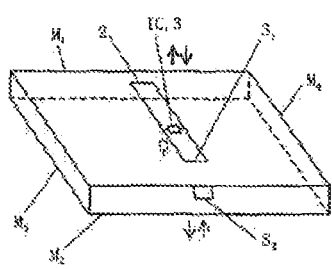
Figure 10:
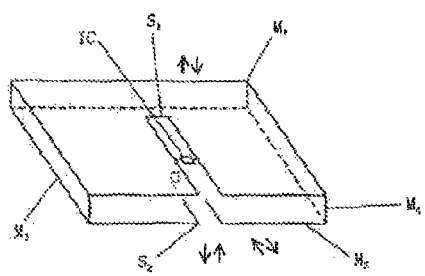
Figure 10:
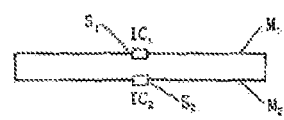
Figure 10:
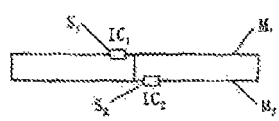

Hereinafter examples of the slot antenna, which can be operated on the metal surfaces as well as in the front surface and rear surface when there are no metal surfaces as referring to FIG. 10.

When metal surfaces $M_1$, $M_2$, respectively having slots, are used in space, radiation takes place in both metal surfaces. When metal surface $M_2$ is mounted on a metal plate, the slot of the metal surface $M_2$ is covered with metal plate, so that impedance is decreased by more than half, but the radiation takes place. It is possible to arrange in the opposite way. Namely, The antenna can work normally on the metal plate, but cannot work apart from the metal plate.

FIG. 10(a) is a sectional view, where the IC 3 is connected to the slot $S_1$ of the upper metal surface $M_1$ and the slot $S_2$, which is parasitically resonated, is formed in the lower metal surface $M_2$. The IC 3 may be arranged between the two metal surfaces, where voltage is relatively high and impedance matching is easily done, as illustrated in dotted line instead of the slot.

FIG. 10(b) is a perspective view of FIG. 10(a). The slot $S_1$ is formed in the upper metal surface $M_1$ and the IC 3 is connected to the slot $S_1$. A resonance circuit is formed by the slot 2 in the metal surface $M_2$. Radiation takes place in both slots $S_1$, $S_2$. It is possible to excite both slots by arranging the IC 3 between the transmission lines.

FIG. 10(c) is a perspective view showing a slot antenna complimentary to the monopole antenna. As explained in FIG. 1(g), since the impedance of ¼ wave slot is more than 1000Ω, it is difficult to match the impedance (resistance component and reactance component).

Since the electric field leakage takes place not in the upper and lower slots but also in lateral directions in this parallel line configuration, leaked electric field can be received in lateral directions. In the case of mono layered transmission line, when the metal surface is covered with a metal plate or the like, the metal surface does not work as the IC tag. In the case of parallel layered transmission lines, since the transmission lines are covered with or interfered by IC tag arranged upward and downward, applications of the IC tag are limited. In order to avoid affects from the lower metal surface, the ¼ wave slot is formed so as to have an open end.

FIGS. 10(d), 10(e) are sectional views showing respective ICs 3 are connected to the slot $S_1$ and the slot $S_2$.

In FIG. 10(d), the slot $S_1$ and the slot $S_2$ are separated by the infinite line. The ICs 3 are respectively connected to the slots $S_1$ and $S_2$. When different IDs are assigned respective ICs 3, front and rear surfaces can be identified.

In FIG. 10(e), the transmission lines and slots are deviated each other. The ICs 3 are respectively connected to the slots $S_1$ and $S_2$, which are arranged in an offset relation. Front surface and rear surface are separately used as IC tags.

Figures 1, 11:
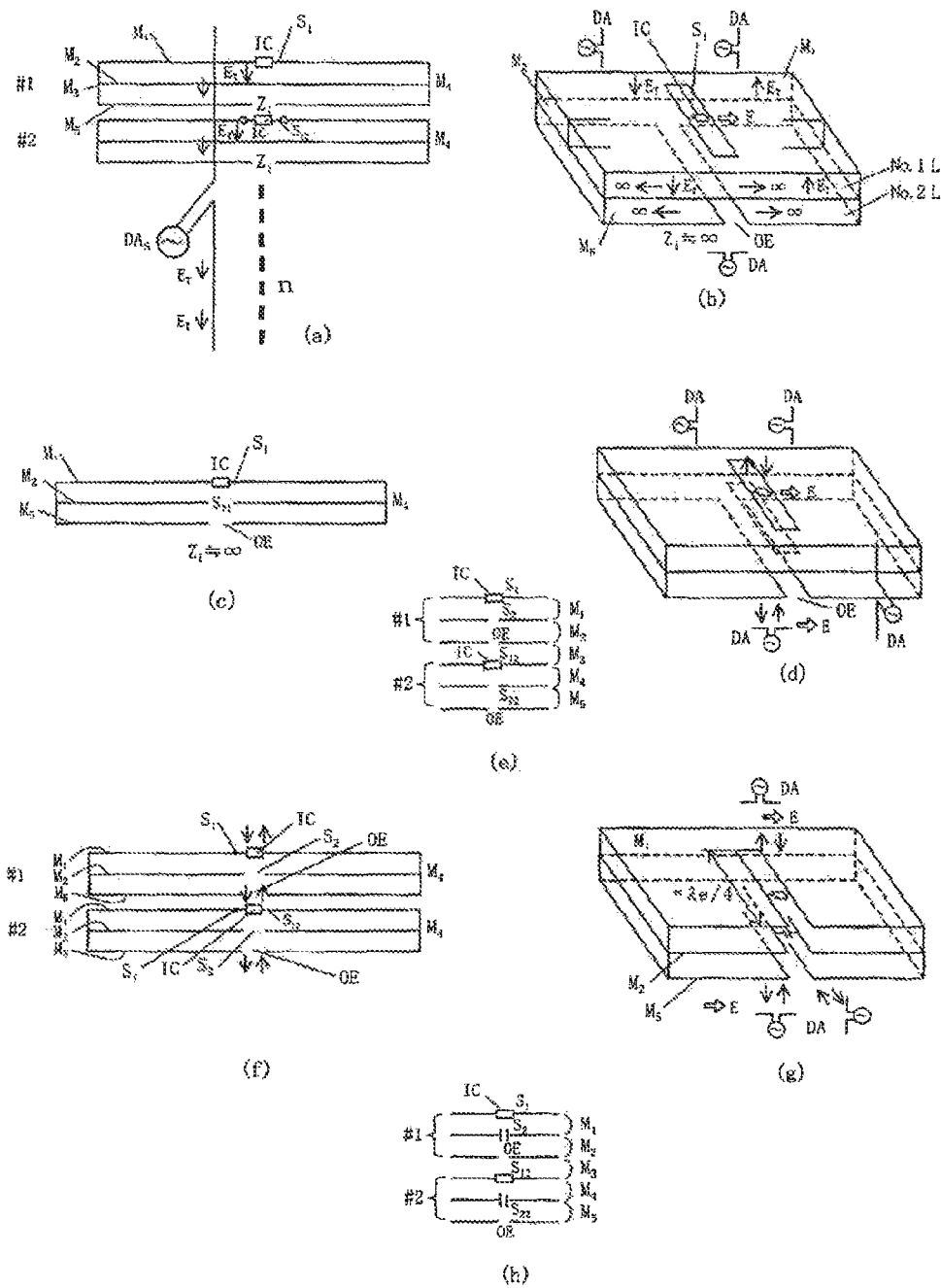
FIG. 11 is schematic views showing multi-layered universal IC tags.
Figures 2, 11:
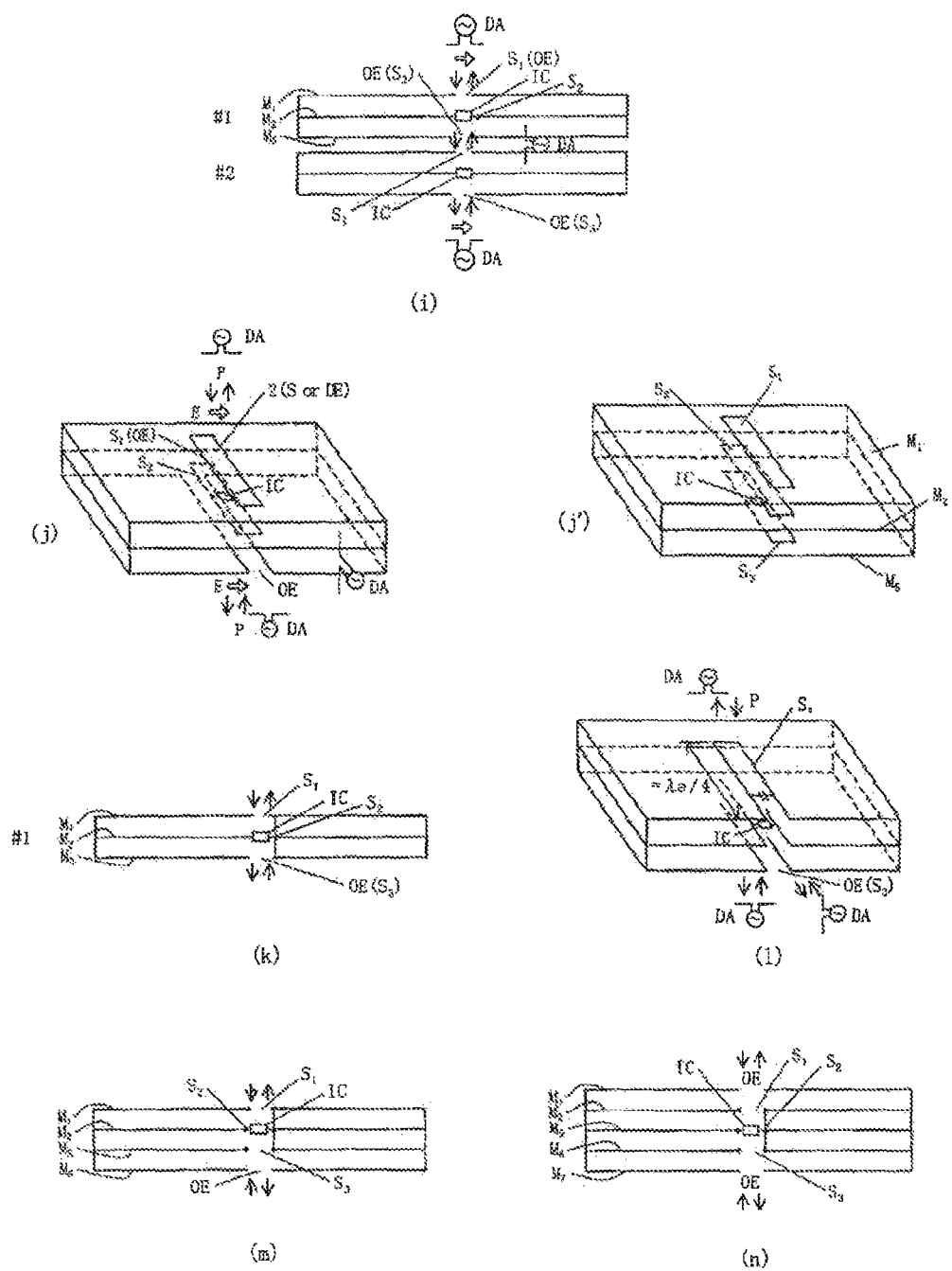

FIG. 11 shows examples of multi-layered transmission lined IC tag configurations.

FIG. 11(a) shows a configuration where a parallel metal surface $M_5$ having an open end (OE) is arranged below the metal surface $M_2$ instead of the slot $S_2$. Due to this open end, a slot $S_{12}$ of #2 universal IC tag works, even if #1 universal IC tag is placed on #2 IC tag, because the open end prevent the slot $S_{12}$ from being short-circuited.

If these lines are excited from lateral directions the ICs 3 and the slots $S_1$, S2 can work and transmit signals, it is useful to pile up the universal IC tags. Antenna for receiving signals from the electric fields $E_{T1}$, $E_{T2}$ ... $E_{Tn}$ may be arranged at a position where the electric field intensity is high. When magnetic field is utilized, the antenna should be arranged at a position where electric current is high.

FIG. 11(b) is a perspective view of FIG. 11(a). Since first parallel line plates No. 1L supplies infinite impedance to the slot $S_1$ and the infinite impedance line of the second parallel line No. 2L receives signals radiated from the IC 3 connected to the slot S12 of IC 3 of #2 universal IC tag arranged below. Thus universal IC tags arranged below #2 universal IC tag work properly, even if universal IC tags are piled up.

FIG. 11(c) is a sectional view showing parallel line comprising the upper metal surface $M_1$ with the slot $S_1$ and the lower metal surface $M_2$ with the slot $S_{21}$. The IC 3 is mounted only in the slot $S_1$ and the slot $S_{21}$ works as a parasitical slot utilized for a resonating slot or merely for a connecting slot.

The metal plate $M_5$ having an open end OE is arranged below. This metal plate supplies nearly infinite impedance to the universal IC tags arranged below #2 universal IC tag, but the open end of the metal plate $M_5$ does not resonate with the slot $S_{21}$.

FIG. 11(d) is a perspective view of FIG. 11(c).

FIG. 11(e) is a sectional view showing a connecting relation between #1 universal IC tag and #2 universal IC tag. Signals of the slot $S_1$ where IC 3 is connected are connected by the slot $S_2$ formed in the metal surface $M_2$, and radiated or transmitted below via the open end OE formed in the metal plate $M_5$. When the IC 3 is arranged between the transmission lines, one side of the slot is short-circuited.

Even if universal IC tags further is piled below #2 universal IC tag, signals from #1 universal IC tag can be transmitted via mutual connections $m_1$, $m_2$, $m_3$ .... In the same way, since signals from a universal IC tag arranged below can be transmitted upward via the mutual connections, signals from all piled up universal IC tags can be read via detecting antennas DA arranged above, below or lateral to the piled up universal IC tags.

If the open end is not required in the rear side, it had better weaken the mutual connections $m_1$, $m_2$ or $m_3$ in order to prevent interference of the resonance in the slot $S_1$ by rendering the slot $S_2$ formed in the metal surface $M_2$ not to resonate.

Hereinafter configurations for λe/4 slot are explained as referring to FIGS. 11(f), 11(g). FIG. 11(f) is a sectional view showing two layered tag configuration with ¼ wave slots. FIG. 11(g) shows a perspective view of FIG. 11(f). Since one end of the slot is opened in the ¼ wave slot configuration, and the electric field leaks from the open end, signals can be detected by the detecting antenna DA arranged in direction lateral to the open end. In order to detect signals from the piled up universal IC tags in lateral positions, ¼ slot configuration is advantageous, because a more compact universal IC tag can be obtained. In some cases however, directive gain of the universal IC tag may be lowered by deteriorated radiation efficiency due to high radiation impedance or by lateral radiation. In the slot where the IC 3 is connected, capacitor of the IC 3 and inductance of the slot resonate. However, it is necessary to connect a capacitor C to the slot of metal surface $M_2$, where the IC 3 is not connected in order to resonate this slot. Thus, the piled up universal IC tag configuration is realized by arranging slots or open ends in metal surfaces below.

FIG. 11(h) is a sectional view showing a connecting relation between #1 universal IC tag and #2 universal IC tag. The slot $S_2$ formed in the metal surface $M_2$ and the slot $S_{22}$ are in a resonating state. However, since these slots interfere with the slot $S_1$ in which the IC 3 is mounted, the slots $S_2$, $S_{22}$ may be used to connect with slots below.

FIGS. 11(i), 11(j) show a universal IC configuration where the IC 3 is connected to the slot $S_2$ of the metal surface $M_2$ and the slot in the metal surface $M_1$ is used as a resonance slot where radiation takes place. A slot $S_3$ is formed in the metal plate $M_5$ below, so that the IC 3 is sandwiched by the slots $S_1$, $S_3$ where radiation takes place symmetrically upward and downward. As a result, it is possible to radiate either upward or downward, even if one of the slots $S_1$, $S_3$ is covered. In this configuration the IC 3 is arranged in the middle position so as to be protected.

When the open end OE is formed in metal plate $M_5$ instead of the slot, a slot formed below is not covered with the metal plate $M_5$. Either the slot or the open end may be formed in the metal M5 depending on an objective of the universal IC tag. In FIG. 11(j), the slot is formed in the metal plate $M_5$. In this configuration radiation takes place symmetrically upward and downward.

FIG. 11(i) is a sectional view showing the electric field Es is received by detecting antennas DA arranged above and blow the piled IC tags. FIG. 11(j) is a perspective view of FIG. 11(i).

FIGS. 11(k), 11(l) show a ¼ wave antenna. The configuration is the same as that of the ½ wave antenna. In order to parasitically resonate the ¼ wave slot in the metal surface $M_1$, it is necessary to connect a capacitor.

FIG. 11(m), (n) are sectional views respectively showing three or four layered universal IC tag configuration.

In these configurations, the upper slot $S_1$ and the lower slot $S_3$ are formed. A plate in which the open end OE is formed is added, in order to avoid the lower #2 universal IC tag from being interfered by the upper #1 universal IC tag.

Thus, the universal IC tag is not covered with other IC tags even if a lot of universal IC tags are piled. Signals from the IC 3 connected to the slot can be read by successively exciting slots downward. Usually, since anti-collision function is attached to the IC 3, ID can be identified among ca. piled IC tags comprising one hundred ICs or so.

When the mutual connections between the universal IC tags are too intensive, interference is caused, which leads to offset of resonance frequency, so that it is rather hard to read the signals. In order to avoid such disadvantage, it had better keep mutual connections at a lower lever. In FIG. 11, configurations where the IC 3 is mounted in the slot are explained. Other configurations explained in FIGS. 8, 10 may be applied for piling the universal IC tags.

Hereinafter examples of the universal IC tags formed in a visiting card size or so are explained as referring to FIG. 12.

Since standard dimensions of a card are 55×85×0.84 (0.76±10%) [in mm], it is necessary to form the universal IC tag smaller than these dimensions. As explained in FIGS. 1, 2, the reduced ½ wave slot length at 920 MHz is ca. 107 mm. In order to shorten the slot length, the slot is deformed in H shape such that additional slots are formed at both ends of the main slot. Further when the additional slots are deformed in zigzag shape, the slot length in y-axis direction can be shortened to less than 50 mm.

Further, a length of the slot must be shortened in exciting direction by electric filed, namely length in x-axis direction of the IC tag must be shortened to a length of card 85 mm or so. Since the card length 85 mm is corresponds to ¼ wave or so, a voltage induced in the slot is the product of intensity of the electric field E×length, namely attained voltage E×0.085 is small. Consequently, a communicable distance of the card-sized IC tag is not so long. In order to keep such communicable distance as long as possible, the IC tag is mounted on the metal surface M so as to induce radiation electric filed or receiving electric field, or so as to make nearly short-circuited state by the capacitive short, such that component $1/(\omega C)$ is reduced to less than 1Ω.

In order to raise impedance of the parallel plate line below the slot infinite, it is necessary to keep a distance from the slot to the short-circuited end $\lambda e/4$, which is attained by bending the parallel line so as to be double layered.

Figure 12:
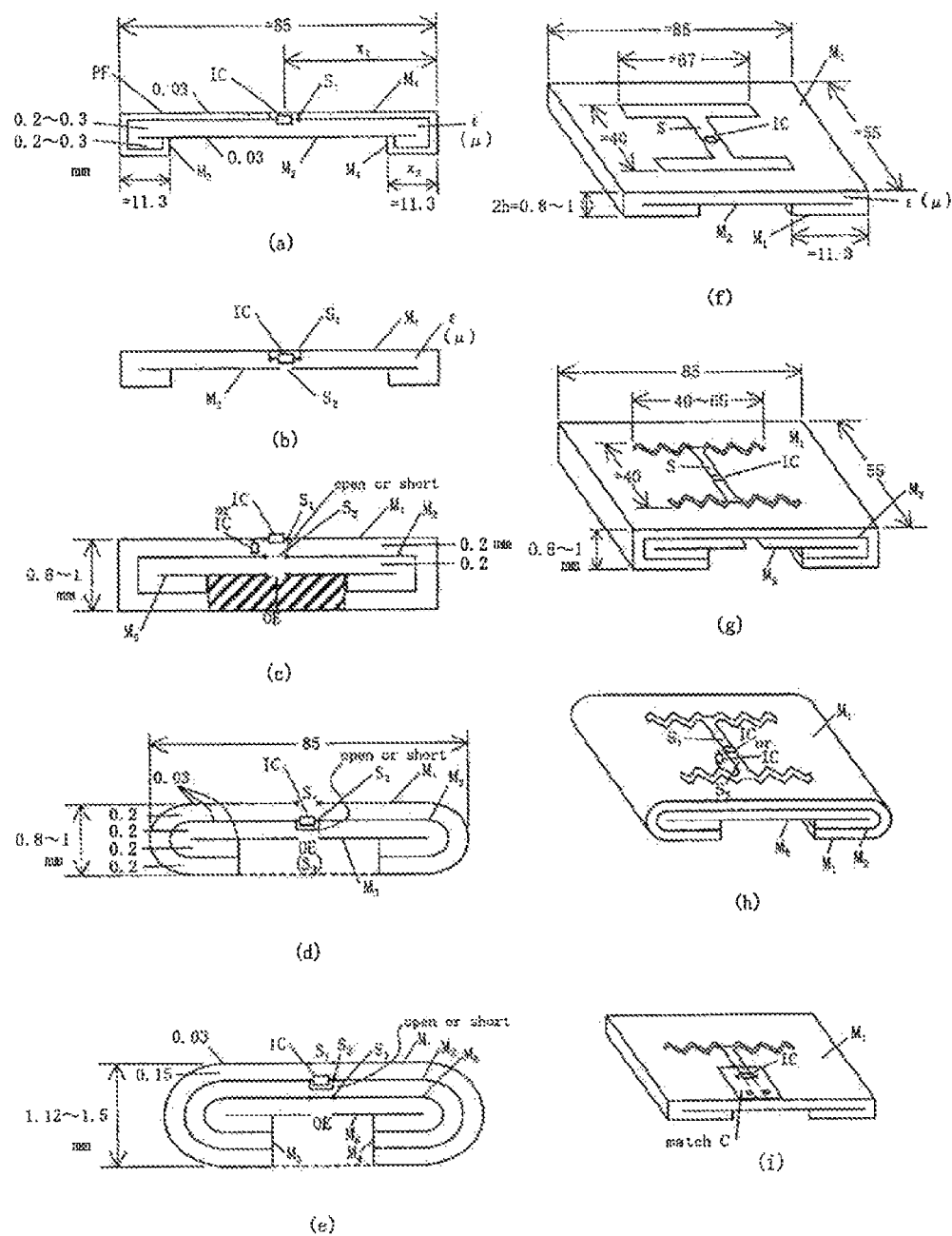
FIG. 12 is schematic views for explaining methods for reducing lines on a card having predetermined sizes.

Embodiments attained by the above-mentioned ways are shown in FIG. 12. FIG. 12(a) is a sectional view along x-axis showing the card at which center an IC is connected. Since an electrical distance from the center of the slot to the short-circuited end is $\lambda e/4$, the calculated distance is 54 mm. In order to operate the card, the effective ¼ wave length should be 54 mm, but allowable transmission distance $x_1$ is a half of the card length 85 mm, namely 42.5 mm, so that a difference 54−42.5≈11.2 mm is required so as to attain $\lambda e/4$. In order to obtain the difference, folded portion having a length $x_2$=11.3 mm should be added at both ends. In other words, the ¼ wave transmission line is obtained by summed distance $x_1+x_2$=53.8 mm. Since the thickness of the card is 0.76±10%, namely ca. 0.8 mm, in the present folded structure a thickness of insulating body, which means, a spacer thickness should be 0.2-0.3 mm. Provided that the thickness of metal plate is 0.01-0.03 mm, summed thickness of the three metal plates is 0.03-0.09 mm, so that when the thickness of the insulating body is 0.2 mm, the total thickness is 0.4+0.09 0.5 mm. And when the thickness of the insulating body is 0.3 mm, the total thickness is 0.6+0.09≈0.7 mm, which is within the card thickness. This folded structure may be formed either by folding both ends of a metal plate with a length of ca. 107 mm or putting the folded portions to a metal plate with a length of 85 mm.

Since the skin depth of aluminum and copper is 2μ (0.002 mm) in 920 MHz, a metal foil with thickness of 1-10μ (0.001-0.01 mm) or a metal coated plastic film is sufficient to work. The metal surface is contacted with other metal surface, covered with plastic film or applied by plastic plates.

FIG. 12(b) is a sectional view showing a IC tag card where the slot $S_2$ is formed in the lower metal surface $M_2$ so as to radiate downward as well as upward.

FIG. 12(c) is a sectional view where other metal surface $M_5$ having the open end OE is added below, so that the slot of the card below or the slot of laterally arranged card is not covered. The present card is formed as 4 layered structure. Hollow portion in this drawing is filled with plastic (hatched portion).

FIG. 12(d) is a sectional view showing a card structure in which the IC tag explained FIGS. 11(i), 11(h), 11(m), or 11(n) is arranged. No ICs are connected to the slot $S_1$ of the upper metal surface $M_1$. Instead the IC is connected to the slot $S_2$ of the metal plate $M_2$. Energy received by the slot $S_1$ excites the slot $S_2$, so that connected IC is excited.

FIG. 12(e) is a sectional view showing a card structure in which a metal surface $M_6$ with an open end OE is further arranged below in the card structure shown in FIG. 12(d). In order to secure the transmission line with ¼ wave length, both end of the card are folded, so that the 6 layered card structure is obtained.

FIG. 12(f) is a perspective view showing a card shaped universal IC tag, where the slot is arranged in a rectangle of 85 mm by 55 mm.

In order to secure a sufficient slot length, the slot is formed in H shape, where additional slots at both ends of the main slot in y-axis extend in ±x-axis direction.

As shown in the drawing, a length of the main slot is 40 mm and a length of additional slots is 67 mm (±33.5 mm), so that the slot with the total length of ca. 107 mm is obtained, as a result, a half wave resonance length is configured.

Since the line length is also configured as ¼ wave length of 53.5 mm, both ends are folded. Since the line length is required 107.5 mm and card length is limited to 85 mm, a difference (107.5−85)/2=11.3 mm is a length of the folded portion at one end. Since a thickness of the card is 0.8-1 mm and the insulating body requires thickness of 0.2-0.3 mm, so that 0.4-0.6 mm for 2 layered structure, a difference 0.2-0.4=(card thickness−insulating body thickness) is a allowable total thickness of the metal surfaces and covered plastic film.

A plastic film on which print is finished, is adhered to or laminated with the card surface.

FIG. 12(g) is a perspective view showing a card shaped IC tag with zigzag shaped additional slots in±x direction arranged at both ends of the main slot in y-axis direction.

As shown in FIG. 12(g), the slot length in x-axis direction is shortened to 40-65 mm, and both ends are bent so that 4 layered structure is obtained. When insulating sheet with a thickness of 0.2 mm is employed, the total thickness of the insulting films is 0.2×4=0.8. Even if 6 layers with a 0.006 mm (each comprising aluminum deposition film with a thickness 0.001 mm) are added, the total thickness is ca. 0.81. If further over coats are applied to both surfaces of the card, the finished thickness will be ca. 1 mm.

If insulating sheet with a thickness of 0.15 mm is employed, the total thickness of the insulting films is 0.15×4=0.6. And aluminum layer with thickness 0.001 mm is deposited on each insulating film, so that total thickness of the deposited insulating films is 0.606≈0.61 mm. If further a plastic film with a thickness of 0.1 mm is applied to both surfaces of the card, the finished thickness will be ca. 0.81 mm.

FIG. 12(h) a perspective view showing a card shaped IC where additionally a slot is formed in the lower most metal surface $M_5$ to the card shaped IC tag shown in FIG. 12(g). The IC 3 connected to the slot of the metal surface $M_2$, and parasitic slots are symmetrically formed in the upper metal surface and the lower metal surface, from which radiation takes place.

One of the characteristic features of the universal IC tag is that the slots of the other metal surfaces work, even if the IC tag is mounted on a metal surface. Since the lower portion has infinite impedance, the IC 3 connected to the center of the slot in the metal surface $M_2$ works even when the IC 3 is arranged in a hollow (vacuum) state or on the metal surface.

FIG. 12(i) a perspective view showing a card shaped IC with a ¼ wave slot. Due to the ¼ wave slot, the card size is small, but in order to resonate the card for supplying power, it is necessary to arrange a capacitor C in the slot as shown in FIG. 12(i).

Since the capacitor is arranged in the slot, virtually no adjustments are required except fine tunings. When the length in x-axis direction is shortened, intensity of induced electric field is decreased, so that a sensitivity of the IC card is deteriorated. However the IC card is mounted on the metal surface, induced voltage is increased by a combined electric current comprising electric current flowing on the metal surface and surface electric current Is, so that radiation efficiency is raised.

Figure 13:
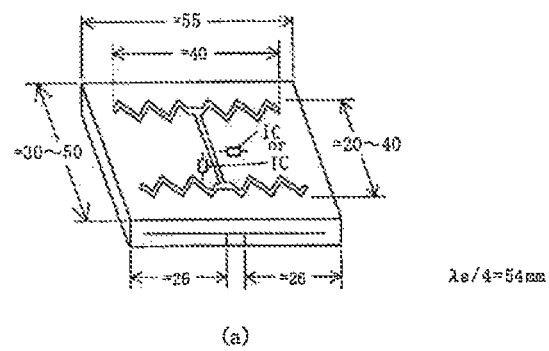
FIG. 13 is schematic views showing a folded universal IC tag.
Figure 13:
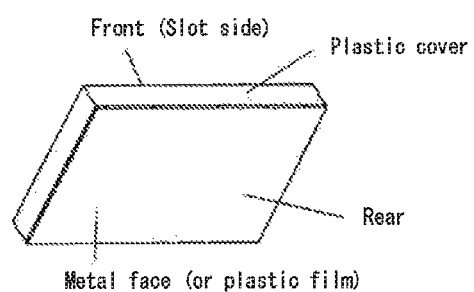
Figure 13:
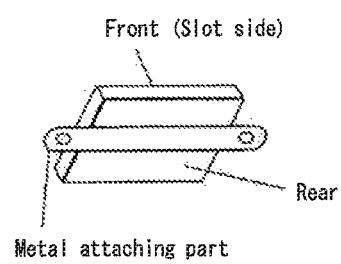

FIG. 13 shows a more compact sized IC card. In order to shorten the length in x-axis direction, it is necessary to lengthen folded portions such that a total length of the transmission line in two layer of the one side is $\lambda e/4$, which means the length of transmission line on one surface is determined as $\lambda e/8$. Values of $\lambda e/4$ correspond to ca. 54 mm in 920 MHz and ca. 49.5 mm in 1000 MHz. In this configuration, intensity of the induced voltage is decreased but it is useful to obtain the compact sized IC card. The length in y-axis direction is also shortened by the changing additional slots in x-axis direction into the zigzag shape. In this way, the line width is reduced to 30-50 mm and length of l the length of the y-axis direction is shortened to 20-40 mm as shown in FIG. 13(a).

The IC card can be more compact sized by folding the metal face so as to form 3 layered structure. As explained above, the IC card can be further compact sized by the magnetic substance sheet. When the IC is placed on the metal surface, the induced electric current is added as explained in FIG. 8(a), so that added electric current can compensate the lost induced current or induced voltage of compact sizing the IC card. The IC card may directly be contacted to the metal surface, but it may be also possible that the IC card is capacitive short-circuited to the metal surface via a thin plastic film, i.e. high frequency short circuiting. In equation $C=\in S/d$, when $d=0.01-0.1\times10^{-3}$m, $S=50\times30\times10^{-6}$ m$^2$ and specific dielectric constant $\in r=2.3$, the calculated value of C is some hundreds pF, so that $1/(\omega C)$ is a small value under decimal value, which means nearly short-circuiting state.

Figures 1, 14:
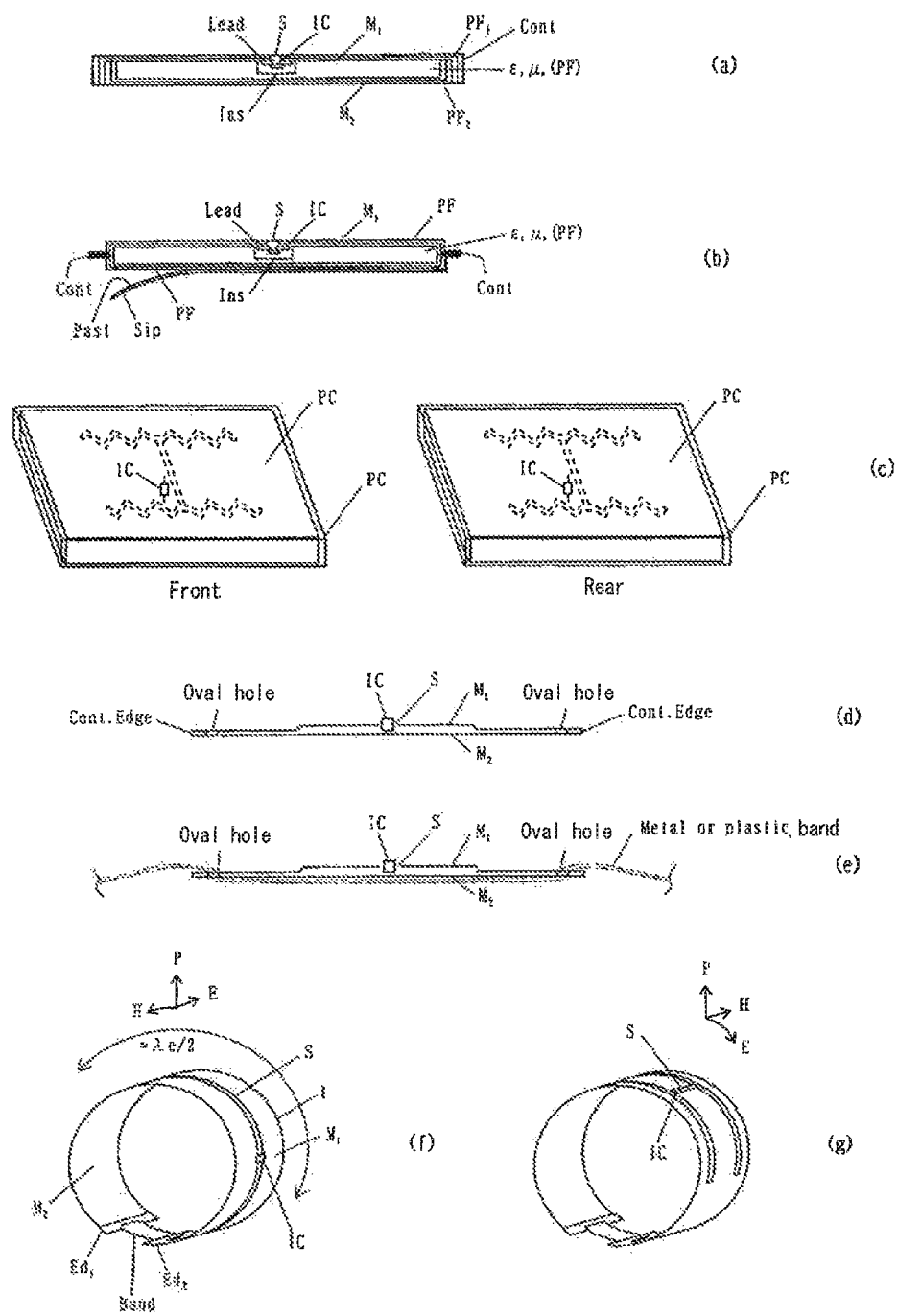
FIG. 14 is schematic views showing applied examples of the universal IC tag.

FIG. 14 shows appearances of the universal IC tags by the present invention. As shown in FIG. 14(a) the IC 3 is connected to the slot S formed by etching the metal surface $M_1$ comprising a PET sheet ($PF_1$) on which aluminum is deposited or with which aluminum is laminated. The upper surface of the metal surface is adhered with a PE or a magnetic substance (μ) sheet with a thickness of 0.2-0.3 mm, in which center a recess for accommodating the IC 3 is formed. The lower surface is adhered with a PET sheet ($PF_2$) on which aluminum is deposited or with which aluminum is laminated, and the $PF_1$ and $PF_2$ are short-circuited (cont) at both ends of the lines via deposited or laminated aluminum. The recess has a thin bottom such that the IC does not directly contact to the metal surface $M_2$ below. Both ends of the card are finished with an adhesive. In this way, the universal IC tag with the thickness of 0.3-05 is configured.

An IC card shown in FIG. 14(b) is configured almost in the same way as that shown in FIG. 14(a), but the rear surface of the card is covered with a silicon paper Sip via paste Past.

FIG. 14(c) is perspective views showing a front surface and a rear surface of the universal IC tag.

FIGS. 14(d), 14(e) are sectional views showing attaching bands and attaching parts of flexible universal IC tags.

FIG. 14(f) is a perspective view showing a flexible universal IC tag with a thickness of 0.3-1 mm, which is able to attach to a curved surface.

At both ends $Ed_1$, $Ed_2$ of the universal IC tag (USAT), are formed for attaching a band (Band) in order to mount the universal IC tag on a curved surface such that the USAT is wound around the curved surface. The slot S in formed in a circumference direction of the curved surface. Electric field E is excited in an axis direction of the curved surface and magnetic field H is excited in the circumferential direction, so that power radiates in any radial direction of the curved surface. This configuration is suitable to apply a metal body, human body or animal body on which the flexible USAT is wound around.

FIG. 14(g) is a perspective view of other flexible USAT, where the slot S formed in the axis direction perpendicular to the slot shown in FIG. 14(f), so that directions of the electric field and the magnetic field are exchanged each other and power radiates in any radial direction. In FIGS. 14(f), (g) a length of the curved surface in the axial direction is short. However, if the curved surface has a sufficient length, a sufficient exciting length by electric field or magnetic field is obtained. And if current flowing in the metal body as capacitive short is utilized, a band typed universal IC tag with high quality is configured.

With respect to the configuration shown in FIG. 14(f), since a length in the axis direction corresponds to an exciting length, it had better secure a sufficient length. Since the length in the axis direction affects slot length, the length in the axis direction should be for example 30-50 mm.

FIGS. 14(h), 14(i), 14(j) and 14(k) are perspective views showing the flexible USATs are wound around metal bars having circular, oval, rectangular and hexagonal cross-sections respectively. Which means the USAT can be attached to the bar having any cross-section, animals and structural bodies including water.

Figure 15:
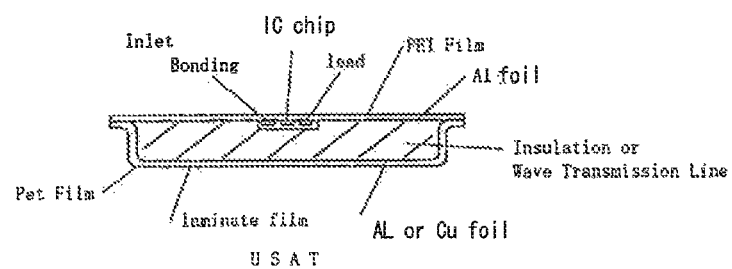
FIG. 15 is schematic views for explaining methods fitting the universal IC tag to the metal surface.
Figure 15:
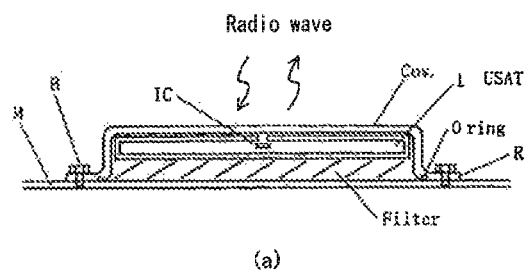
Figure 15:
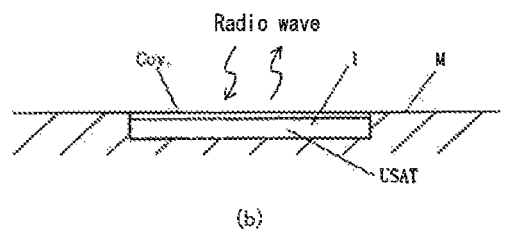

FIG. 15(a) is a sectional view showing a structure of the USAT used outdoors or in polluting environments. In order to attain a weatherability, the universal IC tag 1 is sealed by a molding material after accommodated in a cover Coy. The molded USAT is secured to a metal body M by bolts B at flange part R of the cover Coy. It had better employ an O-ring or a gasket in order to attain watertight sealing.

FIG. 15(b) is a sectional view showing the USAT buried in the metal body M. The universal IC tag 1 is placed in a recess formed in the metal body, and a plastic plate cover Cov. is placed on the universal IC tag 1 such that the upper surface of the plastic cover and the upper surface of the metal body are arranged on the same plane. Thus the USAT is integrated in the metal body and protected from the environments.

Figures 1, 16:
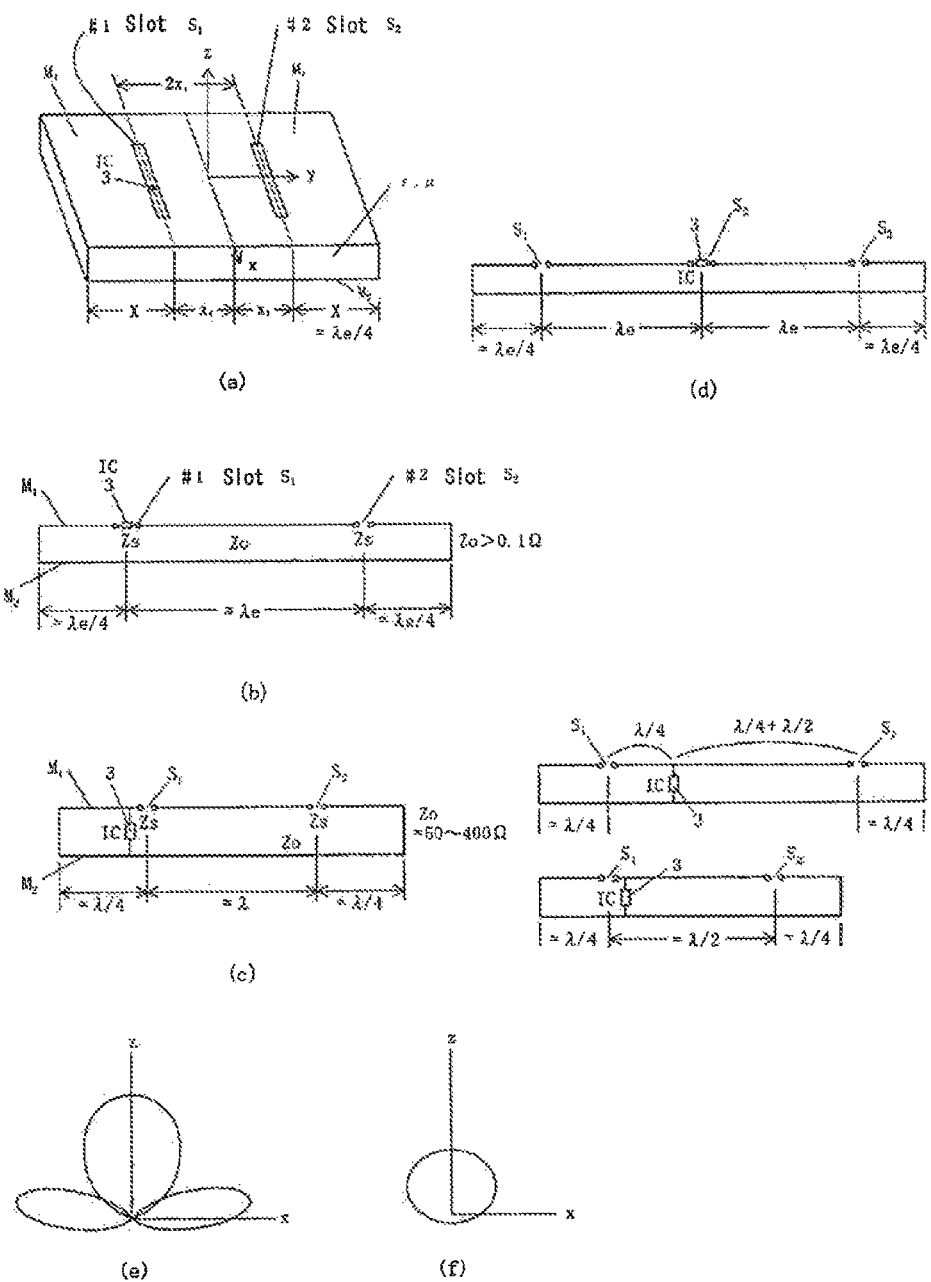
FIG. 16 is schematic views showing radio waves radiating from the metal surface where two or more slots are formed.

FIG. 16(a) is a perspective view showing the metal surface $M_1$ with two slots. The IC 3 is connected to #1 slot $S_1$ on the left. When the transmission line with characteristic impedance Zo is arranged below, power is transmitted to the slot via the transmission line. As explained above, when the transmission line is formed so as to have a thin thickness, the characteristic impedance is reduced and the impedance of the slot is raised, so that it is difficult to match the impedances and to supply power to #2 slot $S_2$ on the right.

FIG. 16(b) is a cross sectional view showing the parallel metal plates having two slots (#1 and #2) arranged a wave of λe apart each other. In this arrangement, if the parallel metal plate is matched by Zs/2, #1 slot $S_1$ and #2 slot $S_2$ obtain the same effects, so that the antenna obtains ca. 3 dB gain compared with one slot. In this case, deterioration of the gain by the standing wave is small. Since the matched impedance of the two slots is not so different from the impedance of the one slot, no adjustments are required. In the same way additional slots can be arranged in parallel. This is one of the advantageous of using the transmission line.

Since power is supplied to #1 slot $S_1$ and #2 slot $S_2$ in the common mode and since the two slots are arranged with a distance of the effective wave length apart each other, the antenna radiates not only in z-axis direction but also in x-axis direction a little bit as shown in FIG. 16(e).

FIG. 16(c) is a sectional view showing parallel configuration where the IC 3 is connected in order to supply power to the IC 3. In the present case, a proper value should be selected for the characteristic impedance Zo of the transmission line in order to match the impedance of the slot, so that sufficient power is supplied to the slot.

For example, when the impedance Zs of the slot is 100Ω, the IC 3 should be attached to a position where the characteristic impedance Zo=100Ω so as to match the impedances. Alternatively, the power supply line of λ/4 wave may be determined so as to satisfy the following equation: $Zic \cdot Zs = Zo^2$.

And, the matching is attained by a slot width, a slot length, a power supply line length $x_1$, transmission line length X and a circuit around the IC.

In FIG. 16(c), a spatial distance between #1 slot $S_1$ and #2 slot $S_2$ is assumed 2.

FIG. 16(d) is a sectional view showing a parallel metal surface configuration where 3 slots are formed with a distance of the effective wave length λe apart in the metal surface $M_1$ in parallel. When the IC 3 is arranged in the center slot $S_2$, power is supplied to the left slot $S_1$ and the right slot $S_3$ via the parallel transmission line. Since slots are arranged in parallel, the calculated impedance the 3 slots corresponds to Zs/3, where Zs is the impedance of the one slot, the IC 3 with the impedance of Zs/3, so that signals from the IC 3 are equally shared among the 3 slots. The signals show high directivity in the common mode directions as shown in FIGS. 16(f) and 16(i), so that the antenna with high gain is obtained without difficulties despite that the characteristic impedance of the transmission line is low.

FIG. 16(e) shows a directivity in the z-x plane of the slots arranged with one wave length apart excited by the common mode. Since the metal surfaces at both sides of the slot have finite lengths, radiation in ±x axis direction takes place a little bit. Intensity of the radiation in z-axis direction depends on the number of the slots and radiation in x-axis direction is added when the slots are arranged with a distance of one wave length apart.

FIG. 16(f) shows a directivity of one ½ wave slot formed in the metal plate with a length of ½-1 wave, where radiation in z-axis direction is maximum. Since the metal surface have finite length in x-axis and z-axis directions, radiation spills over.

FIG. 16(g) is a perspective view a parallel metal surface configuration where 4 slots are formed. The IC 3 is arranged in the center between the metal surface $M_2$ and the metal surface $M_3$ with characteristic impedance of $Zo_2$. Two open ends are formed in the metal surface $M_2$ as a first transmission line and the open ends are used as power supply points FP in the first transmission line.

The 4 slots are exited in common mode, and received energy by the slots is supplied to the IC 3 via transmission line. Namely, power received by #1-#4 slots is transmitted via the transmission line in the first layer with characteristic impedance of $Zo_1$ and accumulated by the transmission line in the second layer with characteristic impedance of $Zo_2$, so that voltage is applied to the IC 3 and power is supplied. FIGS. 16(h), 16(k) are sectional views of the transmission lines. Either the open ends or cutouts may be used as power supply points. The slots may be arranged as shown in FIG. 16(a).

In FIGS. 16(h), 16(k), the IC 3 is connected between the transmission lines, but the IC may be connected to the slots or the open ends OE. When the 4 slots configuration shown in FIG. 16(h) is excited in common mode, a fairy good directivity is attained. In this case a directivity gain is 5-6 dB higher than the single slot. Since the gain of the slot antenna is 3-5 dB higher that that of the dipole antenna, the total gain is raised to ca. 10 dB, so that objects or places to which the universal IC tags are applied may be controlled without difficulties.

A directivity of the configuration shown in FIG. 16(k) is not in z-axis direction but it is inclined in order to radiate or receive $\theta_1$ direction from the z-axis.

This configuration enables to communicate in inclined direction, so that the antenna may be arranged not in right above direction, but in lateral direction. The configuration shown in FIG. 16(d) enables to communicate in the right above direction.

In the configuration of inclined directivity shown in FIG. 16(a), let assume that power supply to the #2 slot delays by $\delta$, #3 slot delays by $2\delta$ and #4 slot delays by $3\delta$ compared with #1 slot when respective slots are arranged with the same distance apart.

When the arranged distance is not the same, it had better compensate phase difference.

FIG. 16(i) shows the directivity obtained by the configurations shown in FIGS. 16(g), 16(h). The drawing shows a strong directivity in z-axis direction. When the impedance of the slot match to that of IC 3, it is necessary to take characteristic impedances $Zo_1$, $Zo_2$ and the line length into consideration. FIG. 16(j) is a sectional view for explaining the impedance Zs per one slot may be determined independent from characteristic impedances $Zo_1$, $Zo_2$.

The impedances are matched as follows. #1 slot $S_1$ and #2 slot $S_2$ are arranged with a distance of $\lambda e/4$ apart. Impedance $Z_{FP1}$ in the center is calculated by equation: $Z_{PF1}=Zo_1^2/2Zs$.

With respect to #3 slot $S_3$ and #4 slot $S_4$, the similar equation is applied: $Z_{FP2}=Zo_1^2/2Zs$.

Further with respect to the left side power supply point FP3, the following equation is applied: $Z_{FP3}=ZO_2^2/Z_{PF1}=2Zs \cdot ZO_2^2/Zo_1^2$.

If the lines have same structure, characteristic impedances $Zo_1$ and $Zo_2$ are the same, so that $Zo_2^2/zo_1^2=1$, as a result $Z_{FP3}=2Zs$.

In the same way, with respect to the right side power supply point FP4, the following equation is applied.

with respect to the left side power supply point FP3, the following equation is applied: $Z_{FP3}=Zo_2^2/Z_{PF1}=2Zs \cdot Zo_2^2/Zo_1^2$.

$Z_{FP4}=Zo_2^2/Z_{PF1}=2Zs \cdot Zo_2^2/Zo_1^2$.

And let assume $Zo_1=Zo_2$, $Z_{FP4}=2Zs$.

Since the fifth power supply point FP5 is arranged in the center with a distance of) $\lambda e/2$ respectively apart from FP3 and FP4, the left side and right side impedances are respectively 2Zs. Since the right side and left side respectively having impedance of 2Zs are arranged in parallel, calculated impedance $Z_{FP5}$ of the FP is: $Z_{FP5}=2Zs/2=Zs$.

As explained above, when the characteristic impedances $Zo_1$ and $Zo_2$ are the same, the impedance matching is done by merely adjusting the line lengths, so that a slot array with 4 stages may be configured without difficulties.

Impedance Zs of the slot and impedance $Z_{IC}$ of the IC 3 can be matched by using a ratio of $Zo_1/Zo_2$ or $Zo_1^2/Zo_2^2$.

Hereinafter, a method maximize the directivity in a direction inclined by angle of $\theta_1$ from z-axis as shown in FIG. 16(m).

The antenna to communicate with the universal IC tag is not always arranged in a lateral direction or right above the IC tag. Sometimes it is favorable or convenient to arrange the antenna is an inclined direction.

In FIG. 16(k), #1 slot $S_1$ and #2 slot $S_2$ are not arranged with an equal distance from the supply point FP1. #2 slot $S_2$ is arranged farther from the PF1, so that power supply to this slot is delayed. In other words, when signals from IC 3 are propagated to #1 and #2 slots via the power supply point FP1, the signals arrive and excite #1 slot $S_1$ earlier. #2 slot $S_2$ is excited with a delay of $\delta=\beta Xs \cdot \sin \theta_1$. Since radio wave from #1 slot $S_1$ advances ahead, phase of radio wave from #2 slot $S_2$ coincides with that of #1 slot $S_1$ in a right direction.

Since the left side power supply point is located nearly in the middle of #1 slot $S_1$ and #2 slot $S_2$, and right side power supply point s located nearly in the middle of #3 slot $S_3$ and #4 slot $S_4$, the respective slots are excited in common mode. Signals or radio wave in common mode received by the respective slots is accumulated in the power supply points FP, via which power is supplied to the IC 3 arranged in the second layer in common mode.

The left end from #1 slot $S_1$ with a distance of $\lambda e/4$ and the right end from #2 slot $S_2$ with a distance of $\lambda e/4$ are short-circuited. In the same way #3 slot $S_3$ and #4 slot $S_4$ are short-circuited. Since impedances of the respective ends are infinite, the radio wave is not propagated beyond the ends, so that power is supplied to the slots.

Thus, phases of #1 slot $S_1$ and #2 slot $S_2$ should coincide in $\theta_1$ direction and phases of #3 slot $S_3$ and #4 slot $S_4$ should coincide in $\theta_1$ direction. In order to attain such phase coincidence in $\theta_1$ direction, the first power supply point is arranged at left side of the IC 3 with a distance of $x_{11}$ and the second power supply point is arranged at right side of IC 3 with a distance of $x_{11}+2\delta$ as shown in FIG. 16(k). Power is supplied to #2 slot $S_2$ with a phase difference of $\delta$, to #3 slot $S_3$ with a phase difference of $2\delta$ and to #4 slot $S_4$ with a phase difference of $3\delta$ from #1 slot $S_1$. Thus the directivity is obtained as shown in FIG. 16(m).

Simple vector calculation of the directivity goes as follows.

$$E(\theta) = F(\theta) \cdot [1 + e^{-j\beta Xs(\sin\theta-\sin\theta 1)} + e - j^{2\beta Xs(\sin\theta-\sin\theta 1)} + e^{-j3\beta Xs(\sin\theta-\sin\theta 1)}]$$

$$= F(\theta) \cdot [(1 - e^{-j4\beta Xs(\sin\theta-\sin\theta 1)})/(1 - e^{-j\beta Xs(\sin\theta-\sin\theta 1)})]$$

$$= F(\theta) \cdot \sin[4\beta Xs \cdot \sin(\theta-\theta_1)/2 \cdot \cos(\theta-\theta_1)/2$$

When value of $\theta$ is near to $\theta_1$, $\sin(\theta-\theta_1)/2=(\theta-\theta_1)/2$, so that $$E(\theta)=F(\theta) \cdot [4\beta Xs \cdot (\theta-\theta_1)/2]/[\beta Xs \cdot (\theta-\theta_1)/2]=4$$

The directivity is maximum when $\theta=\theta_1$.

FIG. 16(l) is a sectional view showing a modified configuration of FIG. 16(k), where the IC 3 is mounted on the metal surface $M_5$ and a metal surface $M_6$ is further arranged below. The configuration shown in FIG. 16(c) may be modified in the same way.

Figure 17:
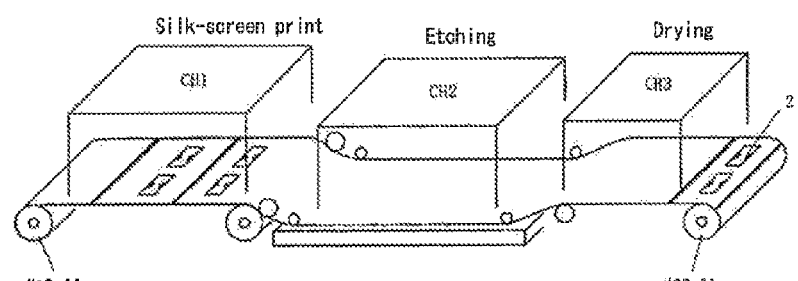
FIG. 17 is a schematic perspective views showing manufacturing lines of the universal IC tag.
Figure 17:
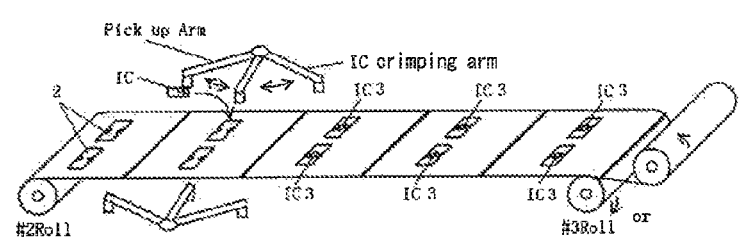
Figure 17:
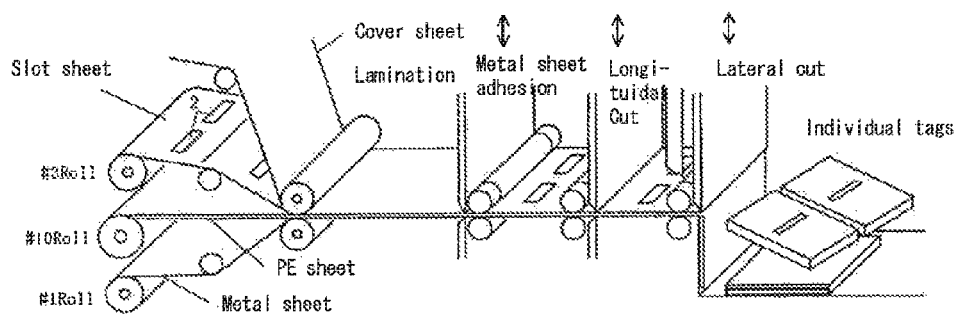

FIG. 17 shows an example of mass production line of the universal IC tag. FIG. 17(a) is a perspective view showing a film preparation line. #1 Roll is maid of a laminated film with width of 1-1.2 m and length of 100 m by laminating aluminum foil or copper foil on plastic film, or made of metal vapor deposited plastic film. Patterns are printed on the film from #1 Roll by a silk-screen method. The printed film is etched such that remove the laminated or deposited metal so as to form slots 2. The etched film is dried and the dried film is wounded as #2 Roll.

FIG. 17(b) is a perspective view showing an IC mounting line. ICs, impedance matching circuits, lead wires and necessary components are mounted in the slots or on the metal laminated or deposited surface of the dried #2 Roll in FIG. 17(a) by utilizing various methods such as adhesion, ultrasonic welding, melting, printing, bonding or the like. The mounted film is wounded as #3 Roll.

When the film is wounded, plastic cover film or spray coating may be applied to the wounding film in order to protect the circuits on the film.

FIG. 17(c) is a perspective view showing an assembling and finishing line of the universal IC tag. Plastic film roll or paper roll for protecting #3 Roll is arranged uppermost position of the line. The #3 Roll is arranged below the protection plastic film or paper roll. #10 Roll of insulating sheet with width of 0.15-3 mm made of PE or PEF (Foamed PE sheet) is arranged below the #3 Roll. And finally #1 Roll is arranged the lower most position. These 4 rolls are unwounded and laminated together. Laminated roll films are cut into respective universal IC tags as shown in FIG. 14.

When the rolls are laminated, paste or silicone paper may be employed.

FIG. 17 shows only two ICs mounted in parallel. However, since this is an example, manufacturing methods of the universal IC tag is not limited to the example shown in FIG. 17. When the IC tags with a width 50 mm are manufactured, 20 IC tags in parallel can be manufactured on the film with a width of 1 m or 24 IC tags can be possible on the film with a width of 1.2 m.

In FIG. 17(c), the rolls are laminated by pasting or heating. The ends of the metal surfaces $M_1$ and $M_2$ are connected by heat welding or ultrasonic welding. After that finished laminated rolls are cut into respective IC tags. As described above, the capacitive short-circuiting is acceptable for short-circuiting of the ends of metal surfaces $M_1$ and $M_2$. In this case, since capacitance value is 100-1000 F, calculated value of $1/\omega C$ is tiny value of p$\Omega$ order at 920 MHz.

Figure 18:
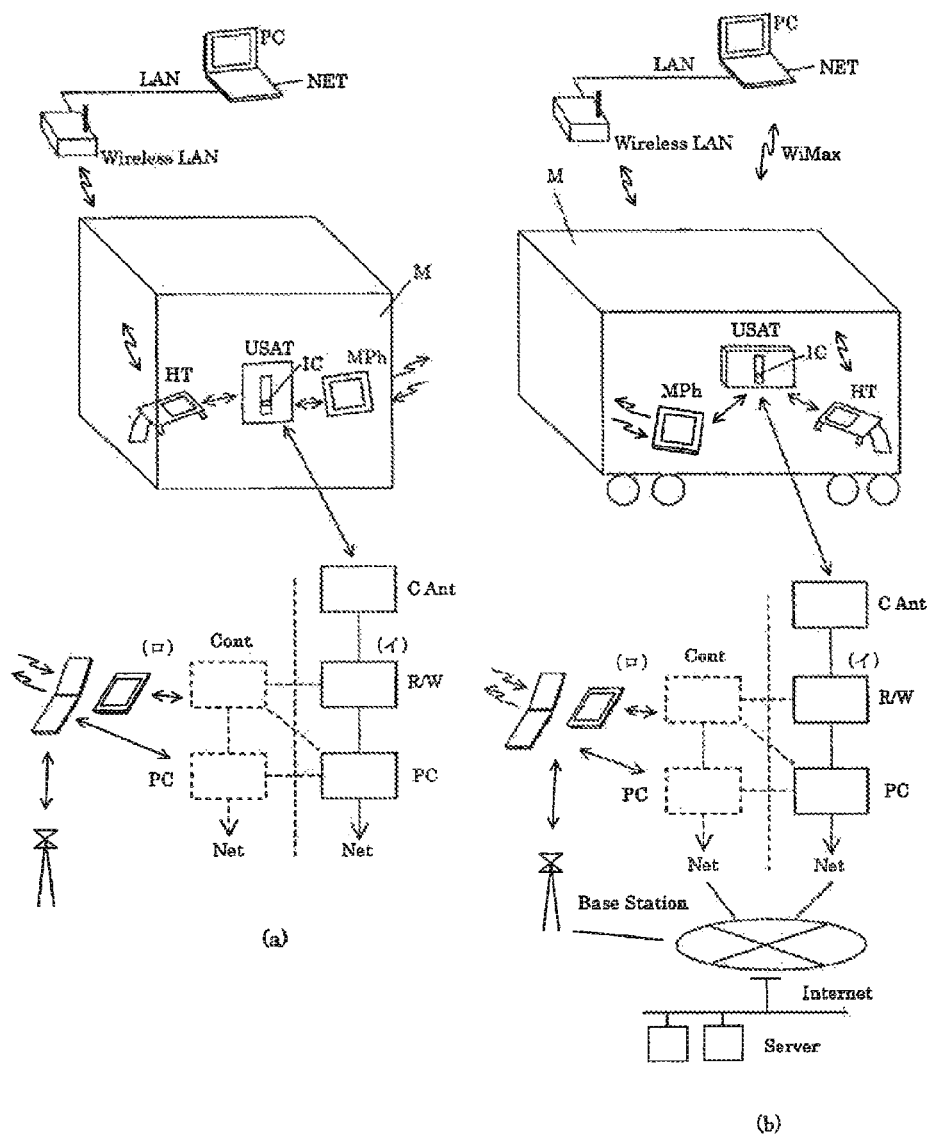
FIG. 18 is schematic views showing applied examples of the universal IC tag in distribution systems.

Hereinafter, application examples of the universal IC tags attached to various objects are explained as referring to FIG. 18.

FIG. 18(a) is a schematic diagram showing the universal IC tag directly attached to machinery (M) to be managed. The universal IC tag is adhered to a chassis of the machinery or attached in a slot formed on the chassis.

When the attaching slot is formed, it had better contact the metal surface of the IC tag to the chassis. If not contacted, the slot in the chassis works as non power supply resonator, which prevent radiation from slot of the IC tag. If the size of the slot is not same as the IC tag, inductance is given to the slot of the chassis so that resonance is destroyed. If the universal IC tag and the slot on chassis are insulated, the impedance of the slot is increased so that it is far from resonating state and no interference is caused in the universal IC tag.

As such example, FIG. 18(a) shows a communication management system (USATS), where the universal IC tag communicate with a fixed circularly polarized antenna (C. Ant), the communication is read and written by a reader/writer (W/R), is recorded and managed by a personal computer (PC). In this communication management system (USATS), data are transmitted via the Internet or network of a dedicated line and records are managed by a server on the network.

Types of circularly polarized antennas (C. Ant) are not limited. A polarized antenna comprising dipole antennas forming in a cross shape so as to add 90 degree phase, a helical plane ring antenna, circularly polarized antenna comprising slots arranged in unparallel as a patch antenna mode may be employed.

In the communication management system (USATS), when a dedicatedly managing the system or a local area network (LAN) is required, a control device and a PC depicted in broken line in FIG. 18(a) may be added to the system.

Data in the universal IC tag can be read out and recorded by a handy terminal (HT) or a mobile phone (MPh) with reading function.

FIG. 18(b) is a schematic diagram showing the communication management system (USATS) where the universal IC tag attached to a vehicle or a truck. The universal IC tag by the present invention may be attached to any machinery or object which has a metal surface. In USATS, signals from the universal IC tag can be read and written by the reader/writer (R/W) via the circularly polarized antenna (C. Ant), and can be recorded and managed by the PC.

Components depicted in broken line at the left side are additional control device and PC for further recording and managing the data. These may be used for forming a LAN or controlling various devices. A wireless LAN may be also employed in the system.

The PC may control programs in the control device, and may transmit data. Data in the universal IC tag can be read out and recorded by the handy terminal (HT) or the mobile phone (MPh) with reading function. Data may be exchanged by the control device (Cont) or the PC comprising a reader/writer. When the PC is connected to the LAN or the Internet, it is possible for system to communicate with specific servers, to record data from the servers and to control the servers via the PC.

Hereinafter other applied examples of the universal ICs are explained as referring to FIG. 19.

In FIG. 19(a) shows a belt conveyer system where products are conveyed. When the conventional IC tag is attached to a container in which metal products are accommodated, the conventional IC tag does not work, even if the container is made of plastic, wood or paper.

On the other hand, the universal IC tag by the present invention works, even when the universal tag is attached to the container in which metal products are accommodated. Therefore, the USATS can be constructed by utilizing the universal IC tags, such that products flowing on the belt conveyer are identified, managed, processed or selected.

Figure 19:
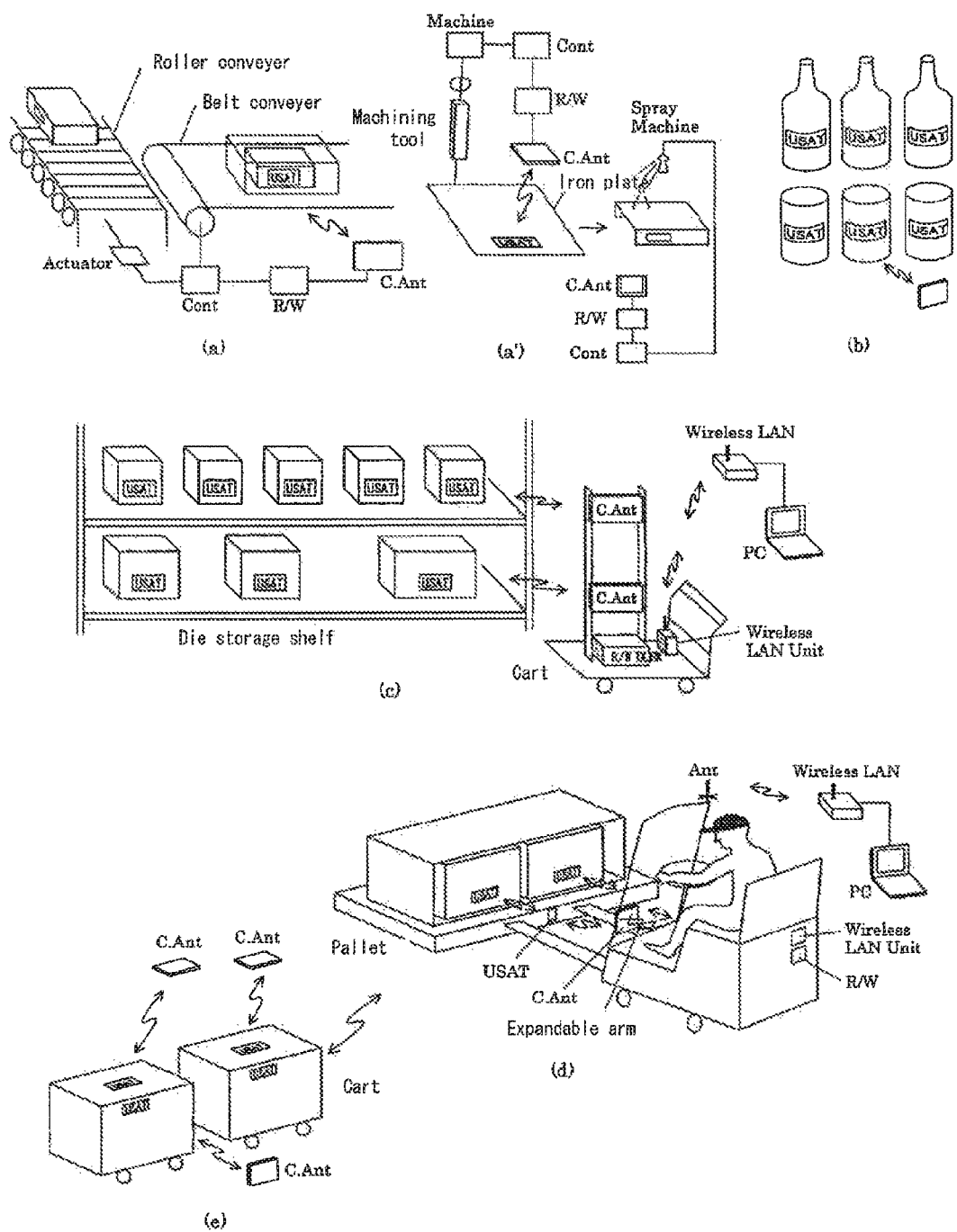
FIG. 19 is schematic views showing applied examples of the universal IC tag in plants.

FIG. 19(a') shows a processing step of iron plate or the like.

The universal IC tag (USAT) by the present invention is attached the iron plate. The ID in the IC tag is read, and the iron plate is automatically processed, assembled and painted according to the read ID.

FIG. 19(b) shows the universal IC tags USATS attached to bottles or cans, in which water is contained. Usually objects containing water absorb or reflect radio wave. Due to these characteristic properties and dielectric constants of the objects, the ordinal tags do not work, but the universal tag by the present invention is not affected by such objects to which the tag is attached.

FIG. 19(c) shows a mold management system where the universal IC tags are attached to respective molds.

Since molds are made of iron, it is rather difficult to be attaching the universal IC tags and be managed by the communication management system (USATS). When a truck or a cart equipped with the circularly polarized antenna (C. Ant), a reader/writer (R/W) and a wireless LAN terminal goes near the shelves, IDs and other necessary data are read from the universal IC tags and read data are transmitted to PCs or servers via a wireless LAN at the site, so that molds are managed.

FIG. 19(d) shows a packaged product management system where the universal IC tags are attached to respective packaged products. The packaged products are identified by the circularly polarized antenna (C. Ant) attached to a fork of the truck and identified information is recorded by the reader/writer (R/W). The C. Ant and the R/W are equipped in a forklift truck for transporting pallets on which packaged products are mounted.

A driver of the forklift truck operates the R/W so as to read the ID and data, which are transmitted from the universal IC tags attached to the products or the pallets to the R/W via the C. Ant. Read ID and data are transmitted to management sites where instructions to deliver or store the products are ordered. Thus the communication management system (USATS) is configured.

FIG. 19(e) shows a product or semi-product management system where the universal IC tags are attached to trucks in which the products or semi-products are temporally stored. The products or semi-products are identified by circularly polarized antennas fixed to ceilings or walls, when the trucks pass by near the antennas. Thus, the communication and management system to manage storage and delivery of the products or semi-products is configured.

Figure 20:
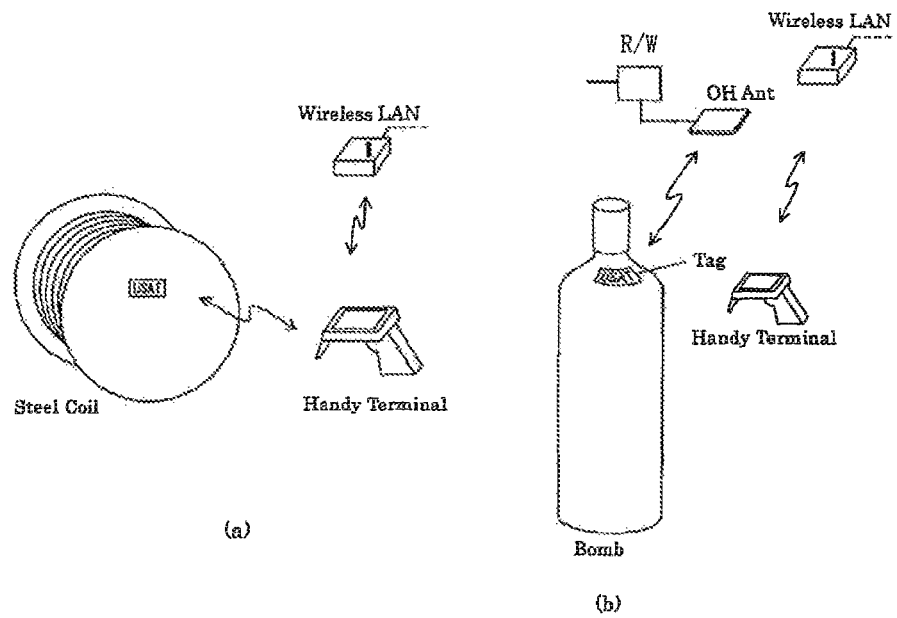
FIG. 20 is schematic perspective views showing applied examples in storage yards.
Figure 20:
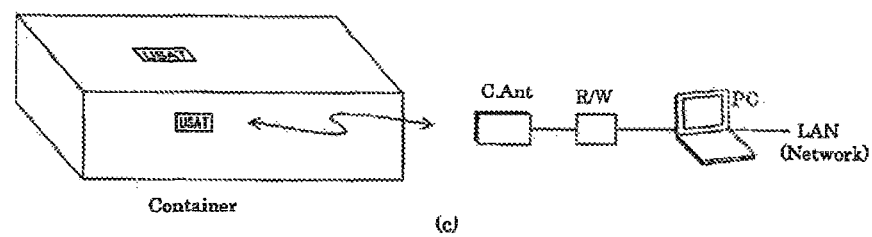
Figure 20:
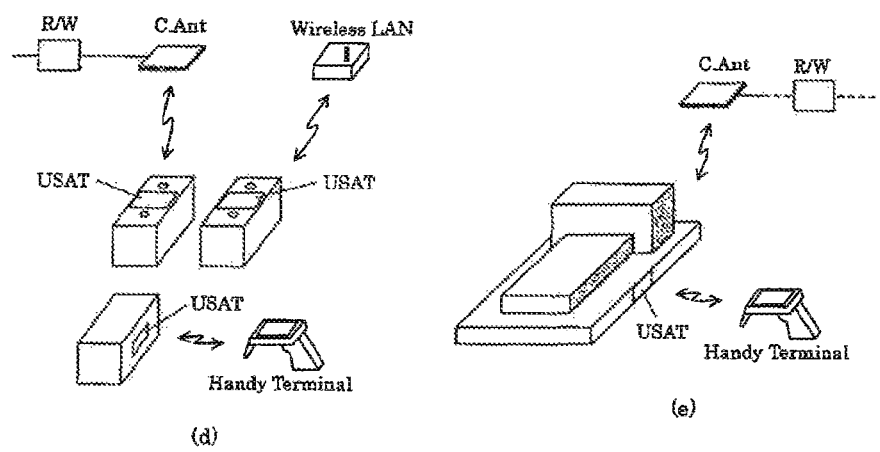

Hereinafter applied examples of the universal IC tags in storage yards and the like are explained as referring to FIG. 20.

FIG. 20(a) shows a part of the system to manage steel coil drums. Actually the drums are closely packed in a yard, it is difficult for naked eyes to identify stored positions of individual drums and to judge whether specific drums exist or not.

At present there are no tags which have a certain communicable distance and are applicable to metal products.

However the communication management system by the present invention can identify such steel coil drums. The handy terminal, the mobile circularly polarized antenna (C. Ant) or the reader/writer (W/R) receives signals from the universal IC tags attached to the individual drums by scanning, so that types, stored positions of the steel coil drums are identified. Thus, the communication management system (USATS), which manages storage of the drums and prevents the drums from being stolen, is configured.

FIG. 20(b) shows a part of the system to manage industrial or domestic gas bombs such as LPG, oxygen bombs or the like. If IDs and contents of the bombs are read simultaneously, man-hours to manage the bombs are remarkably reduced.

There have been desires to replace conventionally used bar code labels with RFID tags for managing such bombs. However, since usual RFID tags do not work near the metal objects, at present the RFID tags have not used for managing the bombs.

When the universal IC tags are employed, a communicable distance from 50 cm to 4 m is attained without being affected by the metal objects, so that filled gas quantity and consumed gas quantity of the individual bombs are managed without difficulties. Drums containing oil are also managed in the same way.

FIG. 20(c) shows a part of the system to manage containers to which the universal IC tags are attached. In this case, since VHF band is used, a little bit larger sized universal IC tag is required. However, a compact sized universal IC tag is obtained by folding the transmission line so as to be downsized less than a length of $\lambda e/4$, so that the communication management system (USATS) having a communicable distance of 10-30 m is configured.

FIG. 20(d) shows a part of the system to manage batteries for electric vehicles or the like. The universal IC tags (USAT) are attached to upper or side faces of the batteries.

FIG. 20(e) shows a part of the system to manage objects in which the universal IC tags are integrated.

Figure 21:
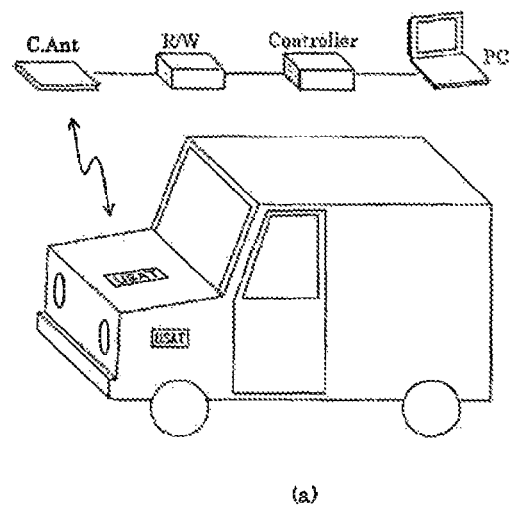
FIG. 21 is schematic views showing applied examples of the universal IC tag in vehicle or airplane component management.
Figure 21:
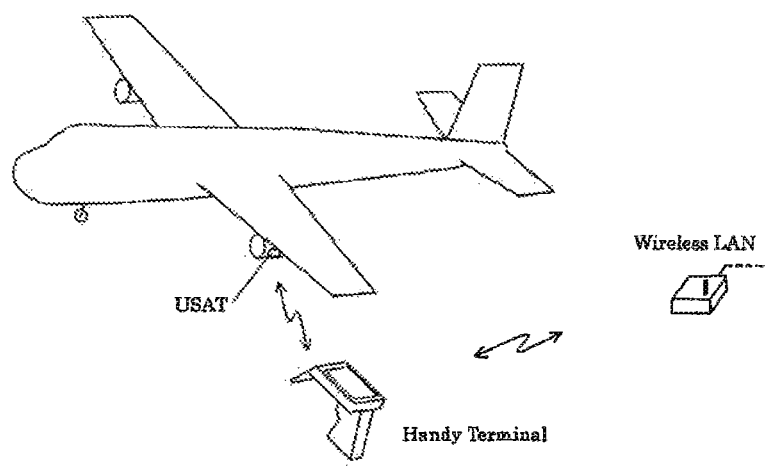

Hereinafter applied examples of the universal IC tags in mobile objects such as vehicles and airplanes are explained as referring to FIG. 21.

FIG. 21(a) shows a part of the system to manage vehicles. The universal IC tags are attached to hoods, roofs, sides or the like of the vehicles. The system also can manage components of the vehicles.

The universal IC tags are suitable to manage special vehicles for rental such as bulldozers, cranes and the like. Further, since the universal IC tags have longer communicable ranges than those of RFIDs or the like, the universal IC tags can be used for managing parking areas.

FIG. 21(b) shows a part of the system to manage airplanes and components. The universal IC tags are suitable to apply components of the airplane for strict maintenance. When the universal IC tags are used in hot environments, they may be protected by insulating materials or ceramics for shielding heat.

Figure 22:
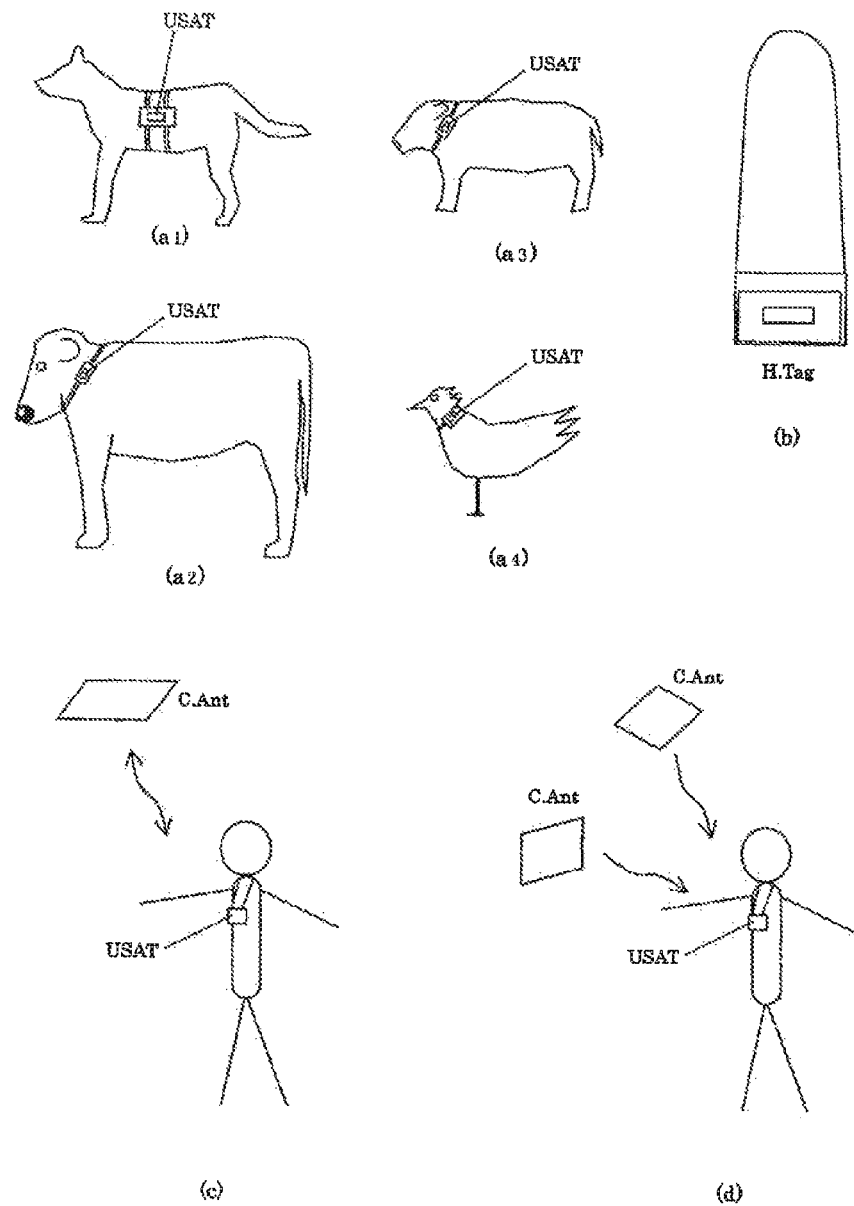
FIG. 22 is schematic views showing applied examples of the universal IC tag in human and animals.

Hereinafter applied examples of the universal IC tags to manage movements and locations of in humans or animals are explained as referring to FIG. 22. The universal IC tags are attached to the animals by fastening bands or suspended from necks of humans. FIGS. 22(a1), (a2), (a3) and (a4) show the universal IC tags wound around the bodies or necks of the animals such as a dog, a pig, a cow and a hen. FIG. 22(b) shows a both-sided universal IC tag (H. Tag) for passing gates, which is suspended from the human neck. Since fixed circularly polarized antennas (C. Ant) can acquire IDs and data of humans passing nearby, locations, movements and behaviors of persons who wear the universal IC tags.

Figure 23:
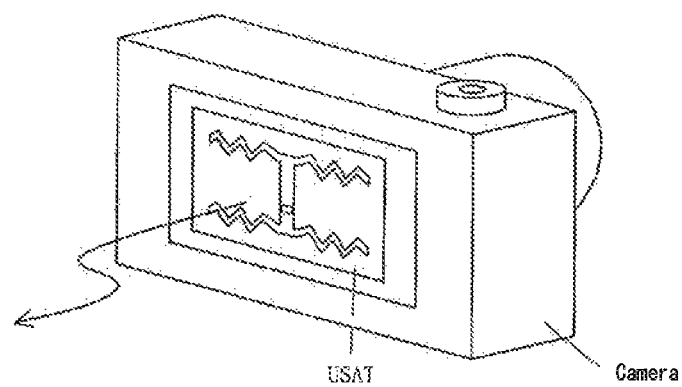
FIG. 23 is a schematic perspective view showing an applied example of the universal IC tag in a camera.

FIG. 23 shows a camera to which the universal IC tag (USAT) is attached for managing inventory control of the camera.

Figure 24:
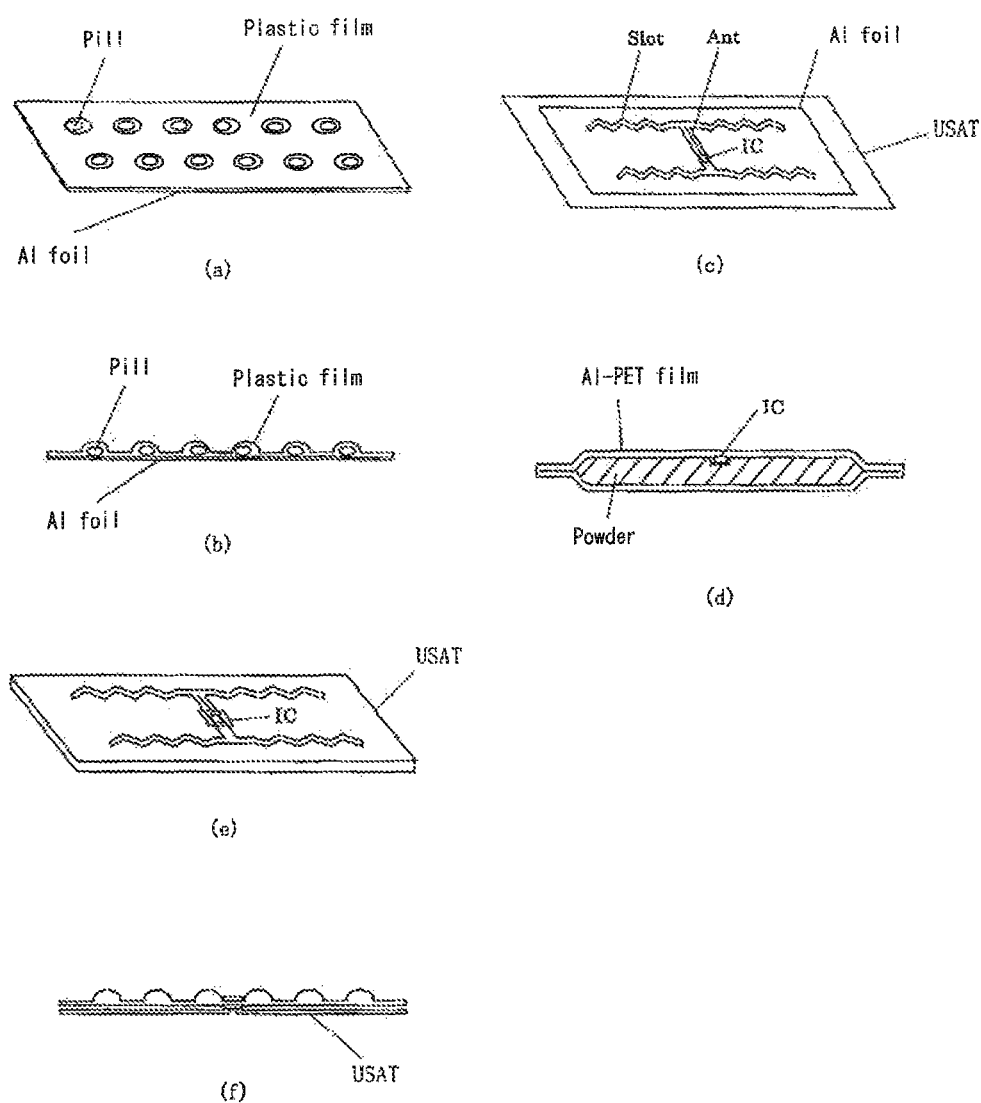
FIG. 24 is schematic views showing applied examples of the universal IC tag in medicines.

Hereinafter applied examples of the universal IC tags in medicines are explained as referring to FIG. 24. FIG. 24(a) is a perspective view of medicine packaged by a thin aluminum laminate. FIG. 24(b) is a sectional view of FIG. 24(a). FIG. 24(c) is a perspective view of the universal IC tag attached to the medicine shown in FIG. 24(a). FIG. 24(d) is a sectional view of powdered medicine packaged by aluminum laminated PET films to which the universal IC tag is attached. FIG. 24(e) is a perspective view of the universal IC tag where insulating bodies are attached to the upper and lower metal surfaces and the IC is arranged in the slot. FIG. 24(f) is a sectional view showing the medicine package to which the universal IC tag shown in FIG. 24(e) is attached.

REFERENCE CHARACTER LIST

1 Universal IC tag
2 Slot
3 IC
4 Substrate (PCB, FPC)
5 Power supply terminal
6 Line (Transformer)
7 IC connecting terminal
8 Lead terminal
9 Lead terminal
11 Power supply pin
12 Power supply terminal
13 Power supply terminal
C Capacitance
E Electric field
Es Electric field in the slot Esr Radiation electric field in the slot
$E_T$ Electric field in parallel plate line
Er Radiation electric field
H Magnetic field
h thickness (height of the parallel plate line)
Is Excited current in the slot
$I_T$ Electric current in the parallel plate line
l Slot length
L Inductance
M Metal surface to which the universal IC tag is attached.
Ms Metal surface in which the slot is formed
$M_1$ Metal surface
$M_2$ Metal surface
$M_3$ Metal surface (short-circuited surface)
$M_4$ Metal surface (short-circuited surface)
$M_5$ Metal surface
$M_6$ Metal surface
$M_7$ Metal surface
$m_1$ Mutual coupling coefficient between the slots
$m_2$ Mutual coupling coefficient between the slots
$m_3$ Mutual coupling coefficient between the slots
$m_4$ Mutual coupling coefficient between the slots
$m_5$ Mutual coupling coefficient between the slot
OE Open end of the parallel plate line
PC Personal computer
Pf Power supplied to the terminals of the transmission line
Pr Power reflected from the terminals
Ps Radiation power in the slot
R Resister
R/W Reader/writer
S Slot
$S_1$ #1 slot
$S_2$ #2 slot
$S_3$ #3 slot
$S_4$ #4 slot
V Voltage
$V_A$ Voltage supplied to the line
$V_S$ Voltage in the slot
$V_T$ Voltage in the parallel plate line
w Line width (in y-axis direction)
w' Line width (in y-axis direction)
w" Line width (in y-axis direction)
X Length (ca. $\lambda e/4$) of the parallel plate line at one side of slot
x
Y Slot length in y-axis direction
y
Zs Impedance of the slot
$Z_A$ Impedance of
$Z_B$ Impedance of the end of the parallel plate line
Zo Characteristic impedance
$\in$ Dielectric constant ($\in o \cdot \in r$)
$\in o$ Dielectric constant in vacuum
$\in r$ Specific dielectric constant
$\mu$ Permeability ($\mu o \cdot \mu r$)
$\mu o$ Permeability in vacuum
$\mu r$ Specific permeability
Nc Propagation velocity of electric magnetic field (=Velocity of light)
$\omega$ Slot width ($4\rho$)
$\rho$ Diameter of the dipole antenna

What is claimed is:

1. A universal IC tag comprising:
a metal sheet $M_1$;
a cutout formed in said metal sheet $M_1$ with a length shorter than a width of said metal sheet $M_1$;
an IC arranged in said cutout, and
a metal sheet $M_2$ arranged in parallel to said metal sheet $M_1$ via an insulating body, wherein:
said cutout radiates radio wave;
a transmission line formed by said metal sheet $M_1$ and metal sheet $M_2$;
further comprising metal sheet $M_3$, and metal sheet $M_4$, wherein said metal sheet $M_1$ and said metal sheet $M_2$ are short-circuited by said metal sheet $M_3$, and said metal sheet $M_4$ at positions in a direction perpendicular to said cutout, and
a theoretical impedance from said cutout formed in said metal sheet ($M_1$) to said metal sheet ($M_2$) is configured to be infinite.

2. A universal IC tag comprising:
a metal sheet $M_1$;
metal sheets $M_2$ arranged at a rear side of said metal sheet $M_1$ via an insulating body; and
metal sheets $M_5$ at the rear side of said metal sheet $M_2$ via said insulating body, wherein:
a cutout is formed in said metal sheets $M_2$,
an IC is arranged in said cutout, and
openings are formed in said metal sheets $M_1$, $M_5$ at positions corresponding to said cutout formed in said metal sheet $M_2$ wherein:
a theoretical impedance from said cutout formed in said metal sheet $M_2$ to said metal sheet $M_1$ or said metal sheet $M_5$ is configured to be infinite.

3. The universal IC tag according to claim 1, wherein:
an opening is formed in said metal sheet $M_2$ at a position corresponding to said cutout.

4. The universal IC tag according to claim 1 or claim 2, wherein:
said cutout has a shape selected from the group consisting of a slot, an H shape, a slot having additional slots with zigzag shape at both ends, a bow tie shape, or a reentrant shape.

5. The universal IC tag according to claim 1 or claim 2, wherein:
a plurality of openings of said metal sheets $M_1$, $M_2$, $M_5$ are arranged so as to attain a directivity gain.

6. The universal IC tag according to claim 1 or claim 2, wherein:
said IC is connected to said cutout via an impedance matching circuit.

7. The universal IC tag according to claim 1 or claim 2, wherein:
an adhesive sheet is attached to one side of said universal IC tag, or said universal IC tag is attached to a band via attaching metal part.

8. The universal IC tag according to claim 1 or claim 2, wherein:
a portion of said metal sheet which is directly contacted to a metal surface, is rendered bare, or a portion of said metal sheet which is directly contacted to a metal surface, is rendered in a state of capacitive short by a thin insulating film.

9. The universal IC tag according to claim 1 or claim 2, wherein:
said universal IC tag is used for managing, pursuing, controlling or recording objects, humans and animals.

10. A manufacturing method of the universal IC tags specified in claim 1, or claim 2, comprising steps of:
punching cutouts with a predetermined distance apart in a long metal sheet;
laminating plastic films on one surface or both surfaces of said punched metal sheet;

arranging ICs in said cutouts during the laminating step, and cutting the laminated composite sheets into pieces so as to obtain individual universal IC tags.

11. A communication management system for managing and controlling the universal IC tags specified in claim 1 or claim 2, or objects to which said universal IC tags are attached, wherein:

the communication management system accesses computers and servers via a network or said objects are processed, selected or stored based on data stored in the universal IC tags.

12. The communication management system according to claim 11, wherein:

managing and controlling procedures are performed via Internet communication.

13. The universal IC tag according to claim 1, further comprising:

a substrate for mounting said IC, wherein:

said substrate is arranged across said cutout formed in said metal sheet $M_1$, and power supply terminals for supplying power to said IC are arranged on said substrate.

14. The universal IC tag according to claim 2, wherein:

said metal sheets $M_1$, said metal sheet $M_2$ and said metal sheet $M_5$ are short-circuited at a position in a direction perpendicular to said cutout and apart ¼ wave electric length from a center of said cutout.

15. A universal IC tag comprising:

a metal sheet $M_1$;

a cutout formed in said metal sheet $M_1$ with a length shorter than a width of said metal sheet $M_1$;

an IC arranged in said cutout, and a metal sheet $M_2$ arranged in parallel to said metal sheet $M_1$ via an insulating body, a metal sheet $M_5$ at a rear side of said metal sheet $M_2$ via said insulating body, a cutout is formed in said metal sheets $M_2$, a metal sheet $M_5$ at a rear side of said metal sheet $M_2$ via said insulating body, wherein:

said cutout radiates radio wave;

a transmission line formed by said metal sheet $M_1$ and metal sheet $M_2$;

a theoretical impedance from said cutout formed in said metal sheet ($M_1$) to said metal sheet ($M_2$) is configured to be infinite, wherein:

respective ICs are arranged in openings formed in the metal sheets $M_1$, $M_2$, $M_5$, and different signals are received by said respective ICs.

* * * * *